United States Patent
Lau et al.

(10) Patent No.: US 10,707,163 B2
(45) Date of Patent: Jul. 7, 2020

(54) LOGIC CELL INCLUDING DEEP VIA CONTACT AND WIRING LAYERS LOCATED AT DIFFERENT LEVELS

(71) Applicant: Samsung Electronics Co., Ltd., Suwon-si (KR)

(72) Inventors: Vincent Chun Fai Lau, Yongin-si (KR); Jung-ho Do, Yongin-si (KR); Byung-sung Kim, Suwon-si (KR); Chul-hong Park, Seongnam-si (KR)

(73) Assignee: SAMSUNG ELECTRONICS CO., LTD., Samsung-ro, Yeongtong-du, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/200,747

(22) Filed: Nov. 27, 2018

(65) Prior Publication Data

US 2019/0109088 A1 Apr. 11, 2019

Related U.S. Application Data

(63) Continuation of application No. 15/493,279, filed on Apr. 21, 2017, now Pat. No. 10,177,087, which is a (Continued)

(30) Foreign Application Priority Data

Jun. 10, 2014 (KR) ........................ 10-2014-0070272

(51) Int. Cl.
*H01L 23/522* (2006.01)
*H01L 27/088* (2006.01)
(Continued)

(52) U.S. Cl.
CPC ........ *H01L 23/5226* (2013.01); *H01L 23/528* (2013.01); *H01L 27/0207* (2013.01);
(Continued)

(58) Field of Classification Search
CPC ............. H01L 23/5226; H01L 27/0207; H01L 27/11807
See application file for complete search history.

(56) References Cited

U.S. PATENT DOCUMENTS

| 5,227,013 A | 7/1993 | Kumar |
| 5,760,429 A | 6/1998 | Yano et al. |

(Continued)

FOREIGN PATENT DOCUMENTS

KR 10-2004-0008047 A 1/2004

*Primary Examiner* — Matthew E. Gordon
(74) *Attorney, Agent, or Firm* — Muir Patent Law, PLLC

(57) ABSTRACT

A semiconductor device includes a substrate; a plurality of conductive areas formed on the substrate at a first vertical level; a first wiring layer formed on the substrate at a second vertical level which is higher than the first vertical level, the first wiring layer including first lines that extend in a first direction, one first line of the first lines connected to a first conductive area selected from the plurality of conductive areas through a via contact; a second wiring layer formed on the substrate at a third vertical level which is higher than the second vertical level, the second wiring layer including second lines that extend in a second direction that crosses the first direction, one second line of the second lines connected to a second conductive area selected from the plurality of conductive areas; and a deep via contact spaced apart from lines of the first wiring layer in a horizontal direction and extending from the second conductive area to the one second line.

17 Claims, 22 Drawing Sheets

Related U.S. Application Data continuation of application No. 14/619,073, filed on Feb. 11, 2015, now Pat. No. 9,653,394.

(51) Int. Cl.
  *H01L 27/02* (2006.01)
  *H01L 27/118* (2006.01)
  *H01L 23/528* (2006.01)

(52) U.S. Cl.
  CPC ........ *H01L 27/088* (2013.01); *H01L 27/0886* (2013.01); *H01L 27/11807* (2013.01); *H01L 2027/11874* (2013.01); *H01L 2924/0002* (2013.01)

(56) References Cited

U.S. PATENT DOCUMENTS

| | | | |
|---|---|---|---|
| 5,834,845 A | 11/1998 | Stolmeijer | |
| 5,898,194 A | 4/1999 | Gheewala | |
| 6,168,984 B1 | 1/2001 | Yoo et al. | |
| 6,239,491 B1 | 5/2001 | Pasch et al. | |
| 6,251,726 B1 | 6/2001 | Huang | |
| 6,303,478 B1 | 10/2001 | Nakamura et al. | |
| 7,329,953 B2 | 2/2008 | Tu | |
| 7,375,389 B2 | 5/2008 | Oh et al. | |
| 7,411,257 B2 | 8/2008 | Yoshizawa et al. | |
| 7,474,000 B2 | 1/2009 | Scheuerlein et al. | |
| 7,955,967 B2 | 6/2011 | La Tulipe, Jr. et al. | |
| 8,252,641 B2 | 8/2012 | Aoki | |
| 8,504,972 B2 | 8/2013 | Hou et al. | |
| 9,653,394 B2 | 5/2017 | Lau et al. | |
| 2007/0033548 A1 | 2/2007 | Tatsumi | |
| 2007/0096154 A1 | 5/2007 | Shimbo et al. | |
| 2007/0152338 A1* | 7/2007 | Kim | H01L 21/76895 257/758 |
| 2008/0169571 A1 | 7/2008 | Izumi | |
| 2009/0230483 A1* | 9/2009 | Mizumura | H01L 21/82343 257/401 |
| 2012/0007038 A1 | 1/2012 | Strukov et al. | |
| 2015/0014778 A1* | 1/2015 | Cheng | H01L 21/8258 257/369 |

* cited by examiner

LOGIC CELL INCLUDING DEEP VIA CONTACT AND WIRING LAYERS LOCATED AT DIFFERENT LEVELS

CROSS-REFERENCE TO RELATED APPLICATIONS

This application is a continuation application of U.S. patent application Ser. No. 15/493,279, filed Apr. 21, 2017, which is a continuation application of U.S. patent application Ser. No. 14/619,073, filed Feb. 11, 2015, which claims the benefit of Korean Patent Application No. 10-2014-0070272, filed on Jun. 10, 2014, in the Korean Intellectual Property Office, the disclosure of each of which is incorporated herein in its entirety by reference.

BACKGROUND

This disclosure relates to a semiconductor device and a method of manufacturing the same, and more particularly, to a logic cell having a via contact and a method of manufacturing the logic cell.

A semiconductor device including an integrated circuit may include a logic gate and a circuit module. According to advancements in electronics technology, integrated circuit devices are rapidly being down-scaled. In down-scaled integrated circuit devices, distances between wirings and distances between contacts are rapidly reduced. To electrically separate the wirings and the contacts that are respectively connected to the wirings, not only the contacts are to be spatially separated but an insulation margin is to be secured by considering various errors that may occur in a photolithography process.

SUMMARY

Aspects of the inventive concept provide a logic cell in which an insulation margin may be secured between wirings and between contacts also when a density of the wirings formed on the same level is increased due to down-scaling of an integrated circuit device.

Aspects of the inventive concept also provide an integrated circuit device having a structure in which scalability may be increased also when a density of wirings that are formed on the same level is increased due to down-scaling of the integrated circuit device.

Aspects of the inventive concept also provide a method of manufacturing a logic cell, whereby an area for routing may be increased in an intracell routing layer of a logic cell having strict design rules Aspects of the inventive concept also provide a method of manufacturing an integrated circuit device that is advantageous for scaling of an integrated circuit device including a logic cell having strict design rules.

According to an aspect of the inventive concept, a semiconductor device includes: a substrate; a plurality of conductive areas formed on the substrate at a first vertical level; a first wiring layer formed on the substrate at a second vertical level which is higher than the first vertical level, the first wiring layer including first lines that extend in a first direction, one first line of the first lines connected to a first conductive area selected from the plurality of conductive areas through a via contact; a second wiring layer formed on the substrate at a third vertical level which is higher than the second vertical level, the second wiring layer including second lines that extend in a second direction that crosses the first direction, one second line of the second lines connected to a second conductive area selected from the plurality of conductive areas; and a deep via contact spaced apart from lines of the first wiring layer in a horizontal direction and extending from the second conductive area to the one second line.

In one embodiment the first direction and the second direction cross each other orthogonally.

In one embodiment, the semiconductor device includes a multi-layer wiring structure including multi-level wiring layers that are formed on the plurality of conductive areas and are respectively at different distances from the substrate, wherein the plurality of conductive areas are formed at a vertical level closer to the substrate than the multi-layer wiring structure, and wherein the first wiring layer is part of the multi-layer wiring structure and includes a group of lines from the multi-layer wiring structure that are formed at a vertical level that is closest to the substrate, and wherein the second wiring layer is part of the multi-layer wiring structure and includes a group of lines that are at a vertical level that is second closest to the substrate from among the layers of the multi-layer wiring structure.

In one embodiment, the semiconductor device further includes at least one source/drain area formed in an active area of the substrate and at least one gate formed on the active area, and the plurality of conductive areas comprise at least one first contact that is connected to the at least one source/drain area and at least one second contact that is connected to the at least one gate.

In one embodiment, the substrate has a main surface that extends in the horizontal direction, and a horizontal width of a lower surface of the deep via contact is smaller than a horizontal width of an upper surface of the deep via contact.

In one embodiment, the deep via contact has a lower surface that abuts the second conductive area and an upper surface that abuts the one second line, and an area of the lower surface is smaller than an area of the upper surface.

In one embodiment, the deep via contact and the one second line are integrally formed.

In one embodiment, an other second line of the second wiring layer is connected to each of a third conductive area and a fourth conductive area selected from the plurality of conductive areas and extends in parallel to the one second wiring line at the third level on the substrate. The semiconductor device may additionally include a first deep via contact that extends from the third conductive area to the other second line, and a second deep via contact that extends from the fourth conductive area to the other second line.

The first deep via contact, the second deep via contact, and the other second line may be integrally formed.

In one embodiment, the semiconductor device further includes a power line connected to a first active area of the substrate and a ground line connected to a second active area of the substrate, wherein the power line and the ground line are disposed at the first level on the substrate and extend in parallel to the one first line at the first level on the substrate.

In one embodiment, the one second line extends in a direction orthogonal to the power line and the ground line.

In one embodiment, one of the plurality of conductive areas comprises an active area of the first logic cell. Another of the plurality of conductive areas may further comprise a gate formed on the active area of the substrate.

In certain embodiments, the plurality of conductive areas comprise at least one of a gate, a source, and a drain of a fin field effect transistor (FinFET) formed on the substrate.

In another embodiment, the plurality of conductive areas comprise at least one of a gate, a source, and a drain of a planar type metal oxide semiconductor field effect transistor (MOSFET) formed on the substrate.

According to one aspect of the disclosed embodiments, a semiconductor device includes a substrate; a plurality of conductive contacts disposed on the substrate at a first vertical height above the substrate; a plurality of first wiring lines parallel to each other and disposed at a second vertical height above the substrate higher than the first vertical height, each first wiring line extending in a first direction; a plurality of second wiring lines parallel to each other and disposed at a third vertical height above the substrate higher than the second vertical height, each second wiring line extending in a second direction different from the first direction; a first conductive via extending vertically between a first contact of the plurality of conductive contacts and a first particular wiring line of the plurality of first wiring lines, such that the first contact is directly connected to the first particular wiring line of the plurality of first wiring lines through the first conductive via; and a second conductive via extending vertically between a second contact of the plurality of conductive contacts and a first particular wiring line of the plurality of second wiring lines, such that the first contact is directly connected to the first particular wiring line of the plurality of second wiring lines through the second conductive via. The second conductive via is at a different horizontal location from any of the first wiring lines.

In one embodiment, the semiconductor device includes a plurality of interlayer insulating layers, the first conductive via passes through only a single interlayer insulating layer, and the second conductive via passes through the single interlayer insulating layer and one or more additional interlayer insulating layers.

In one embodiment, the plurality of conductive contacts, plurality of first wiring lines, plurality of second wiring lines, first conductive via, and second conductive via are all part of a logic device, and the logic device further includes: a gate line of a transistor disposed on the substrate, the gate line vertically aligned with and electrically connected to the second conductive via; and an active region of the substrate vertically aligned with and electrically connected to the first conductive via.

In one embodiment, the semiconductor device further includes a third conductive via extending vertically between the first particular wiring line of the plurality of first wiring lines and a second particular wiring line of the plurality of second wiring lines, the third conductive via at a different horizontal location from the second conductive via and the first conductive via.

In other aspects of the disclosed embodiments, a semiconductor device includes: a substrate; a plurality of conductive contacts disposed on the substrate at a first vertical level above the substrate, including at least a first conductive contact connected to a gate line and at least a second conductive contact connected to a source/drain area; a plurality of first wiring lines parallel to each other and disposed at a second vertical level above the substrate higher than the first vertical level, each first wiring line extending in a first direction; a plurality of second wiring lines parallel to each other and disposed at a third vertical level above the substrate higher than the second vertical level, each second wiring line extending in a second direction different from the first direction; a single-layer via contact extending vertically between the first contact of the plurality of conductive contacts and a first particular wiring line of the plurality of first wiring lines, such that the first contact is directly connected to the first particular wiring line of the plurality of first wiring lines through the single-layer via contact; and a deep via contact extending vertically between the second contact of the plurality of conductive contacts and a first particular wiring line of the plurality of second wiring lines, such that the second contact is directly connected to the first particular wiring line of the plurality of second wiring lines through the deep via contact. The deep via contact is at a different horizontal location from any of the first wiring lines.

BRIEF DESCRIPTION OF THE DRAWINGS

Exemplary embodiments of the inventive concept will be more clearly understood from the following detailed description taken in conjunction with the accompanying drawings in which:

FIG. 2A is a cross-sectional view corresponding to the cross-section along a line 2A-2A' in FIG. 1, FIG. 2B is a cross-sectional view corresponding to the cross-section along a line 2B-2B' in FIG. 1, FIG. 2C is a cross-sectional view corresponding to the cross-section along a line 2C-2C' in FIG. 1, and FIG. 2D is a cross-sectional view corresponding to the cross-section along a line 2D-2D' in FIG. 1.

DETAILED DESCRIPTION OF THE EMBODIMENTS

Figure 1:
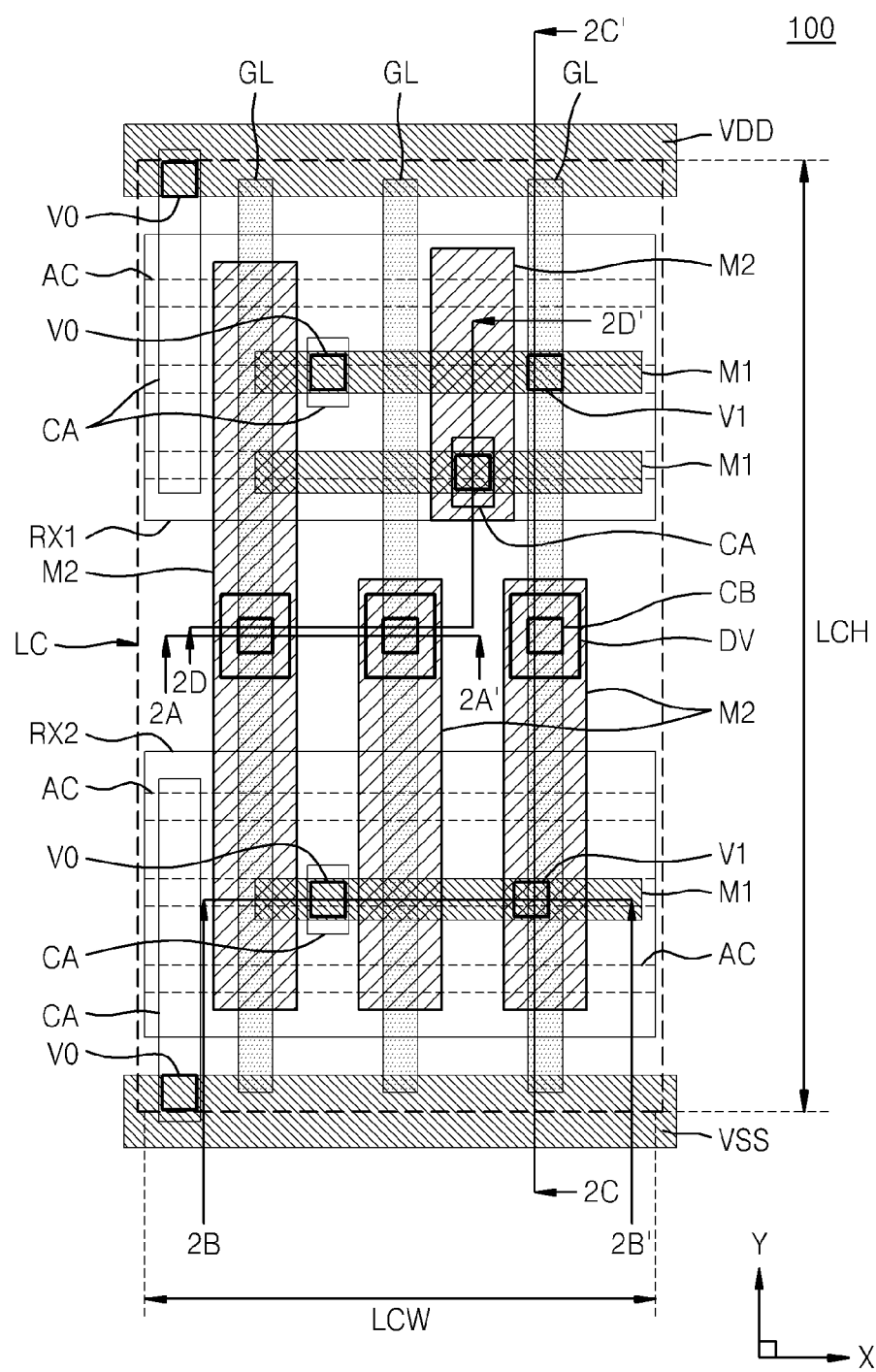
FIG. 1 is a layout diagram of a logic cell according to embodiments of the inventive concept.

Hereinafter, the inventive concept will be described more fully with reference to the accompanying drawings, in which exemplary embodiments of the invention are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, like elements are labeled like reference numerals and repeated description thereof will be omitted.

As used herein, the term "and/or" includes any and all combinations of one or more of the associated listed items. Expressions such as "at least one of," when preceding a list of elements, modify the entire list of elements and do not modify the individual elements of the list. Further, as used herein, the singular forms "a", "an" and "the" are intended to include the plural forms as well, unless the context clearly indicates otherwise.

In the present description, terms such as 'first', 'second', etc. are used to describe various members, areas, layers, regions, and/or components. However, unless indicated otherwise, these terms should not be construed as indicating any particular order or whether an element is at the upper or lower side or superior or inferior, and are used only for distinguishing one member, area, layer, region, or component from another member, area, layer, region, or component. Rather, unless the context indicates otherwise, these terms are used merely as a naming convention—to distinguish different components from each other. Thus, a first member, area, layer, region, or component which will be described may also refer to a second member, area, layer, region, or component, without departing from the teaching of the inventive concept. For example, without departing from the scope of the inventive concept, a first component may be referred to as a second component, and similarly, a second component may be referred to as a first component.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, unless the context indicates otherwise, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

For example, the context may indicate otherwise if a first component is described as "directly connecting" to a second component through a third component. In this case, a connection is formed between the first component and the second component through the third component without any other components connecting between the first component and the third component or between the second component and the third component.

Unless defined differently, all terms used in the description including technical and scientific terms have the same meaning as generally understood by those skilled in the art. Terms that are commonly used and defined in a dictionary should be construed as having the same meaning as in an associated technical context, and unless defined apparently in the description, the terms are not ideally or excessively construed as having formal meaning.

When an embodiment is implementable in another manner, a predetermined process order may be different from a described one. For example, two processes that are consecutively described may be substantially simultaneously performed or may be performed in an opposite order to the described order, unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a layout diagram of a logic cell 100 according to embodiments of the inventive concept. The logic cell may be a semiconductor device, also referred to herein as an integrated circuit device. As used herein, a semiconductor device may generally refer to one or more of the different integrated circuits including logic cells described herein. A semiconductor device may also refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include logic devices such as a microprocessor or controller, or memory devices such as volatile or non-volatile memory devices, which include logic integrated circuits.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Figure 2A:
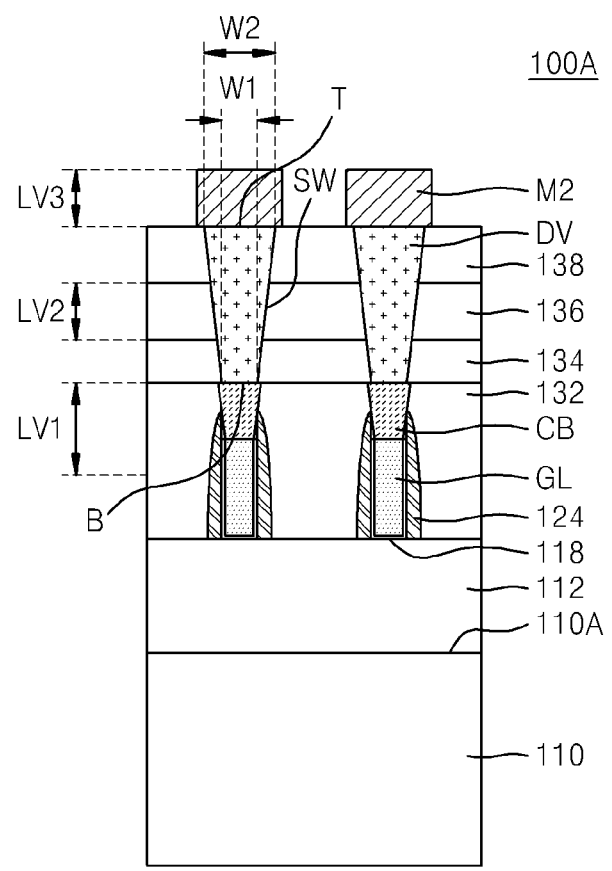
FIGS. 2A through 2D are cross-sectional views of a logic cell which may have the same layout as the logic cell of FIG. 1; in detail.
Figure 2B:
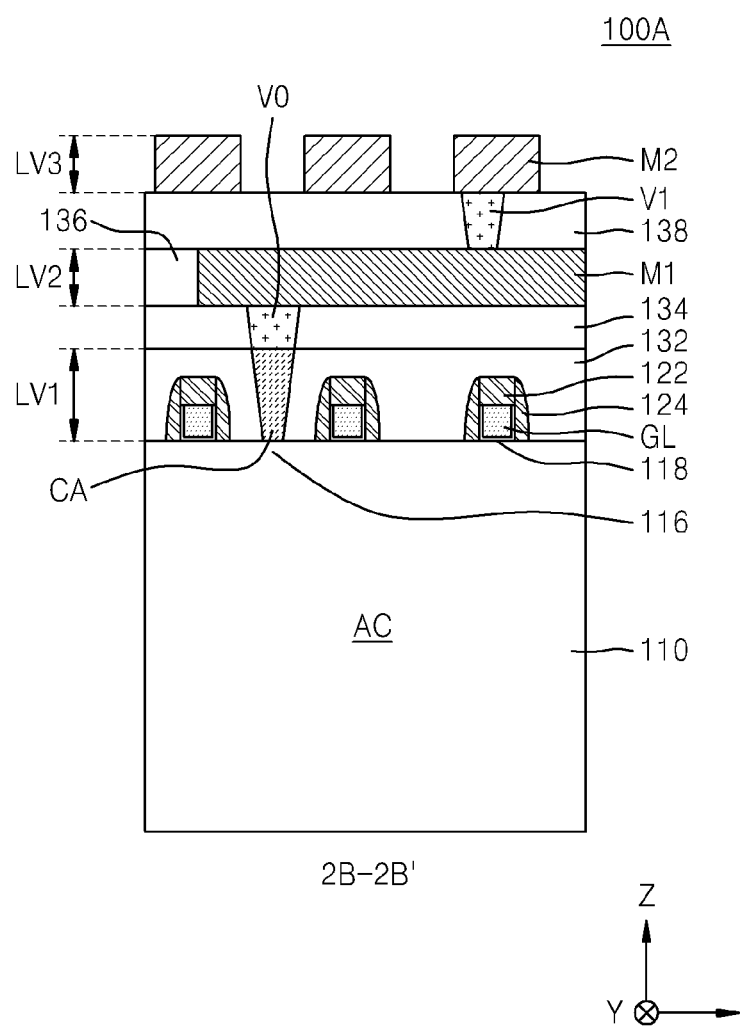
Figure 2C:
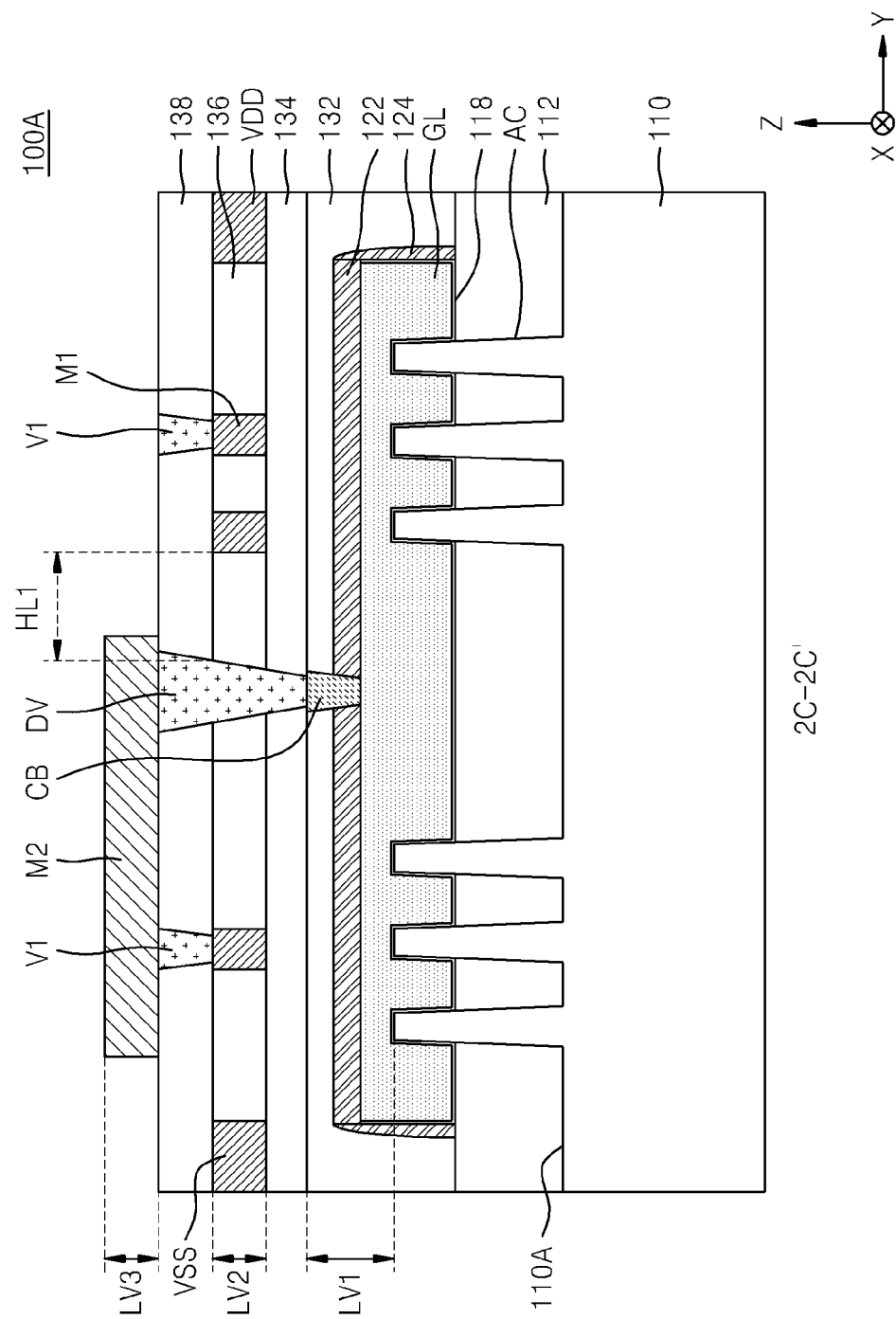
Figure 2D:
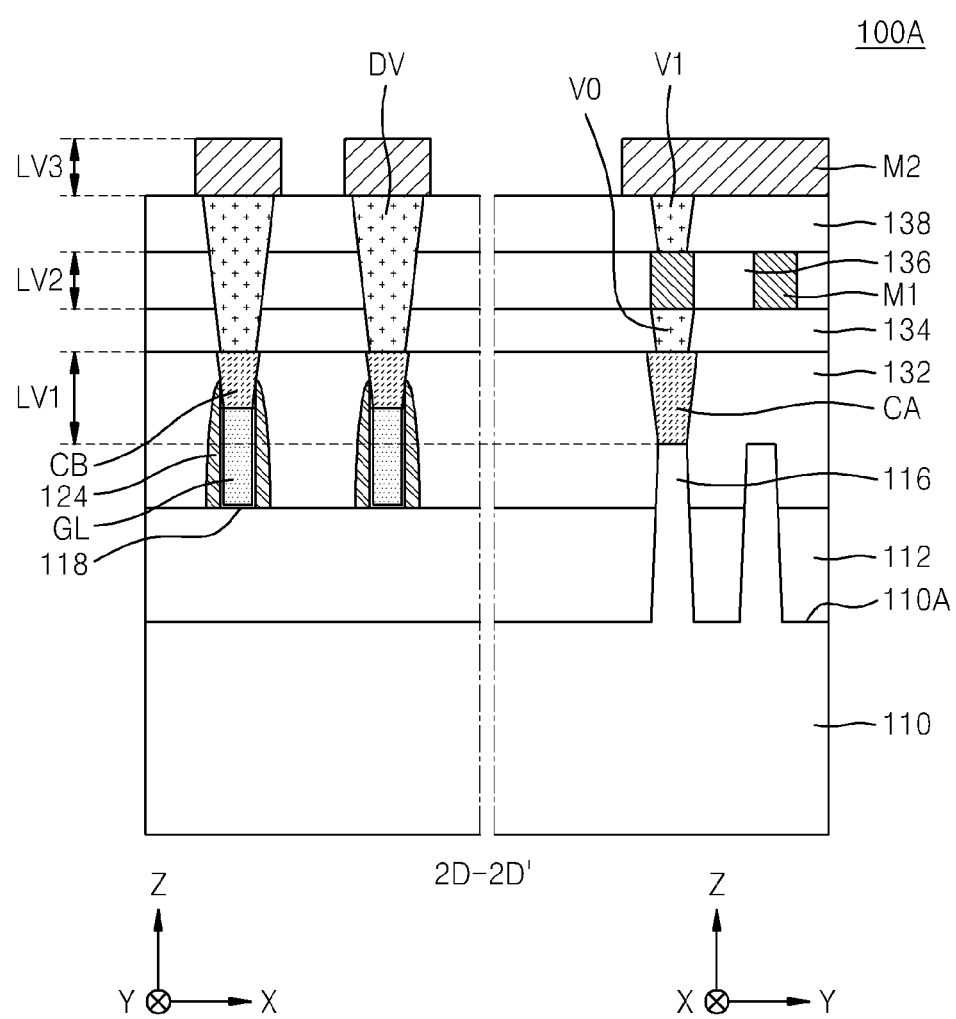

FIGS. 2A through 2D are cross-sectional views of a logic cell 100A which may have the same layout as the logic cell 100 of FIG. 1, and illustrate a portion of the logic cell 100A that includes a fin field effect transistor (FinFET). FIG. 2A is a cross-sectional view of the logic cell of FIG. 1 cut along a line 2A-2A'. FIG. 2B is a cross-sectional view of the logic cell of FIG. 1 cut along a line 2B-2B'. FIG. 2C is a cross-sectional view of the logic cell of FIG. 1 cut along a line 2C-2C'. FIG. 2D is a cross-sectional view of the logic cell of FIG. 1 cut along a line 2D-2D'.

Referring to FIGS. 1 and 2A through 2D, a substrate 110 having a main surface 110A that extends in a horizontal direction (X direction and Y direction of FIG. 1) has a logic cell area LC.

In some embodiments, the substrate 110 may include a semiconductor such as Si or Ge or a compound semiconductor such as SiGe, SiC, GaAs, InAs, or InP. According to another embodiment, the substrate 110 may have a silicon on insulator (SOI) structure. The substrate 110 may include a conductive area such as an impurity-doped well or an impurity-doped structure.

The logic cell area LC of the substrate 110 includes a first device area RX1 and a second device area RX2, in each of which a plurality of fin-type active areas AC protruded from the substrate 110 are formed.

The plurality of active areas AC extend in parallel to one another in a direction (X direction in FIG. 1). A device isolation layer 112 is formed between the plurality of active areas AC on the substrate 110. The plurality of active areas AC protrude from the device isolation layer 112 in the form of fins.

A plurality of gate insulation layers 118 and a plurality of gate lines GL extend on the substrate 110 in a direction in which they cross the plurality of active areas AC (Y direction in FIG. 1). The plurality of gate insulation layers 118 and the plurality of gate lines GL extend while covering an upper surface and two sidewalls of each of the active areas AC and an upper surface of the device isolation layer 112. A plurality of metal oxide semiconductor (MOS) transistors are formed along the plurality of gate lines GL. The MOS transistors may be MOS transistors having a three-dimensional structure in which channels are formed in the upper surface and the two sidewalls of the active areas AC.

In certain embodiments, the gate insulation layers 118 may be formed of a silicon oxide layer, a high-k dielectric layer, or a combination of these. The high-k dielectric layer may be formed of a material having a higher dielectric constant than a silicon oxide layer. For example, the gate insulation layers 118 may have a dielectric constant of about 10 to about 25. The high-k dielectric layer may be formed of a material selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but is not limited thereto. The gate insulation layers 118 may be formed, for example, by using an atomic layer deposition (ALD) method, a chemical vapor deposition (CVD) method, or a physical vapor deposition (PVD) method.

The plurality of gate lines GL extend on the gate insulation layers 118 across the plurality of active areas AC while covering the upper surface and the two side surfaces of each of the active areas AC.

In some embodiments, the gate lines GL may have a structure in which a metal nitride layer, a metal layer, a conductive capping layer, and a gap-fill metal layer are sequentially stacked. The metal nitride layer and the metal layer may include at least one selected from Ti, Ta, W, Ru, Nb, Mo, and Hf. The metal layer and the metal nitride layer may be formed, for example, by using an ALD method, a metal organic ALD method, or a metal organic CVD (MOCVD) method. The conductive capping layer may function as a protection layer that prevents oxidization of a surface of the metal layer. Also, the conductive capping layer may function as an adhesive layer (wetting layer) that facilitates deposition of another conductive layer on the metal layer. The conductive capping layer may be formed of a metal nitride such as a TiN or TaN or a combination of these, but is not limited thereto. The gap-fill metal layer may fill spaces between the active areas AC and extend on the conductive capping layer. The gap-fill metal layer may be formed of a W (e.g., tungsten) layer. The gap-fill metal layer may be formed, for example, by using an ALD method, a CVD method, or a PVD method. The gap-fill metal layer may bury recess space, which is formed by a step portion on an upper surface of the conductive capping layer, without a void in the space between the active areas AC.

A plurality of conductive contacts CA and CB are formed at a first level LV1 on the active areas AC. The plurality of conductive contacts CA and CB include a plurality of first contacts CA connected to a source/drain area 116 of the active areas AC and a plurality of second contacts CB connected to the gate lines GL.

The plurality of conductive contacts CA and CB may be insulated from each other by a first interlayer insulation layer 132 that covers the active areas AC and the gate lines GL. The plurality of conductive contacts CA and CB may have an upper surface that is at the same level as an upper surface of the first interlayer insulation layer 132. The first interlayer insulation layer 132 may be formed of a silicon oxide layer, but is not limited thereto.

A second interlayer insulation layer 134 and a plurality of lower via contacts V0 that pass through the second interlayer insulation layer 134 are formed on the first interlayer insulation layer 132. The second interlayer insulation layer 134 may be formed of a silicon oxide layer, but is not limited thereto.

A plurality of first unidirectional wiring layers M1 that extend in a horizontal direction at a second level LV2 which is higher than the first level LV1 are formed on the second interlayer insulation layer 134. The wiring layers M1 are unidirectional in that at a particular vertical level, they are continuously formed only in one direction (e.g., the X direction in this example).

The first unidirectional wiring layers M1 may extend in parallel to one another in a first direction (X direction) that is parallel to an extension direction of the main surface 110A of the substrate 110 on the second interlayer insulation layer 134.

Each first unidirectional wiring layer M1 may be connected to one contact selected from the plurality of conductive contacts CA and CB, for example, the first contact CA or the second contact CB, via one lower via contact V0 selected from the plurality of lower via contacts V0 formed between the first level LV1 and the second level LV2. Each contact of the plurality of lower contacts V0 may be connected to one of the plurality of conductive contacts CA and CB, for example, to the first contact CA or the second contact CB by passing through the second interlayer insulation layer 134. The plurality of lower via contacts V0 may be insulated from one another by the second interlayer insulation layer 134.

In the logic cell area LC, a power line VDD may be connected to an active area AC which is in the first device area RX1, and a ground line VSS may be connected to an active area AC which is in the second device area RX2. The power line VDD and the ground line VSS may be respectively connected to the active area AC of the first device area RX1 and the active area AC of the second device area RX2 through one of the plurality of lower via contacts V0.

The power line VDD and the ground line VSS may extend in parallel to the first unidirectional wiring layers M1 on the second level LV2. In some embodiments, the power line VDD and the ground line VSS may be formed at the same time with the first unidirectional wiring layers M1. The first unidirectional wiring layers M1, the power line VDD, and the ground line VSS may be formed to pass through a third interlayer insulation layer 136. The third interlayer insulation layer 136 may insulate the first unidirectional wiring layers M1, the power line VDD, and the ground line VSS from one another.

A height LCH of the logic cell area LC, also described as a length, may be defined with respect to a direction of a shortest distance (Y direction) between the power line VDD and the ground line VSS. Also, a width LCW of the logic cell area LC may be defined according to a direction (X direction) that is parallel to the power line VDD and the ground line VSS.

According to one embodiment, in order to secure a design margin whereby limitations due to a minimum spacing rule of a line tip-to-line side (hereinafter referred to as "tip-to-side"), which will be described later with reference to FIG. 13A), the first unidirectional wiring layers M1 may all extend in one direction, for example, in a direction of the width LCW (X direction) of the logic cell LC.

According to another embodiment, in a portion of the logic cell area LC where the first unidirectional wiring layers M1 are relatively congested, the plurality of first unidirectional wiring layers M1 extend only in the direction of the width LCW (X direction) of the logic cell area LC, and in a portion of the logic cell area LC where the first wiring layers M1 are not congested, a plurality of wiring layers at the same level as the first unidirectional wiring layers M1 may partially extend in the direction of the height LCH of the logic cell area LC within a range not violating the minimum spacing rule of tip-to-side.

The lower via contacts V0, the first unidirectional wiring layers M1, the power line VDD, and the ground line VSS may have a stacked structure of a barrier layer and a wiring conductive layer. The barrier layer may be formed, for example, of TiN, TaN, or a combination of these. The wiring conductive layer may be formed, for example, of W, Cu, an alloy thereof, or a combination thereof. A CVD method, an ALD method, or an electroplating method may be used to form the first unidirectional wiring layers M1 and the lower via contacts V0.

A fourth interlayer insulation layer 138 covering the third interlayer insulation layer 136 and the first unidirectional wiring layers M1 may be formed on the third interlayer insulation layer 136 and the first unidirectional wiring layers M1. The fourth interlayer insulation layer 138 may be formed of a silicon oxide layer, but is not limited thereto. In some embodiments, the first through fourth interlayer insulation layers 132, 134, 136, and 138 may be formed of the same material. In some other embodiments, at least some of the first through fourth interlayer insulation layers 132, 134, 136, and 138 may be formed of different materials. For example, the first through fourth interlayer insulation layers 132, 134, 136, and 138 may be formed of any one layer selected from a tetra ethyl ortho silicate (TEOS) layer and a ultra low K (ULK) layer having a ultra low dielectric constant K of about 2.2 to about 2.4 such as a SiOC layer and a SiCOH layer.

A plurality of upper via contacts V1 that pass through the fourth interlayer insulation layer 138 may be formed on the first unidirectional wiring layers M1.

A plurality of second unidirectional wiring layers M2 that extend in a horizontal direction and cross the first unidirectional wiring layers M1 at a third level LV3 which is higher than the second level LV2 are formed on the upper via contacts V1.

The upper via contacts V1 and the second unidirectional wiring layers M2 may be stacked with a barrier layer and a wiring conductive layer. The barrier layer may be formed, for example, of TiN, TaN, or a combination of these. The wiring conductive layer may be formed, for example, of W, Cu, an alloy of these, or a combination of these. A CVD method, an ALD method, or an electroplating method may be used to form the second unidirectional wiring layers M2 and the upper via contacts V1.

The second unidirectional wiring layers M2 may extend on the fourth interlayer insulation layer 138 in a direction parallel to an extension direction of the main surface 110A of the substrate 110 along the direction of the height LCH (Y direction) of the logic cell area LC. As illustrated in FIG. 1, an extension direction of the second unidirectional wiring layers M2 may be orthogonal to the extension direction of the first unidirectional wiring layers M1, but is not limited thereto.

In a portion of the logic cell area LC, the second unidirectional wiring layers M2 may be connected to one selected from the conductive contacts CA and CB through a deep via contact DV. The deep via contact DV may extend between one selected from the conductive contacts CA and CB and one selected from the second unidirectional wiring layers M2 in a direction (Z direction) orthogonal to the main surface 110A of the substrate 110. According to one embodiment, the deep via contact DV may pass through from one of the second unidirectional wiring layers M2 through the second through fourth interlayer insulation layers 134, 136, and 138 to one of the conductive contacts CA and CB, for example, up to the first contact CA or the second contact CB.

In another portion of the logic cell area LC, the second unidirectional wiring layers M2 may be connected to one of the first unidirectional wiring layers M1 through one of the upper via contacts V1 formed between the second level L2 and the third level LV3. The upper via contacts V1 may pass through the fourth interlayer insulation layer 138 and extend to one of the first unidirectional wiring layers M1.

The deep via contact DV may be spaced apart from the first unidirectional wiring layers M1 in a horizontal direction (X direction or Y direction) so that the deep via contact DV does not overlap with the first unidirectional wiring layers M1 in a vertical direction (Z direction). Also, the deep via contact DV may be spaced apart from the lower via contacts V0 and the upper via contacts V1 in a horizontal direction (X direction or Y direction) so that the deep via contact DV does not vertically overlap with the lower via contacts V0 and the upper via contacts V1.

In some embodiments, as illustrated in FIGS. 2A, 2C, and 2D, the deep via contact DV may have a lower surface B that abuts on the first contact CA or the second contact CB and an upper surface T that abuts on one of the second unidirectional wiring layers M2. Thus the deep via contact DV may have a lower surface B that contacts the first contact CA or second contact CB and an upper surface T that contacts the second unidirectional wiring layers M2. A width W1 of the lower surface B of the deep via contact DV in the horizontal direction (X direction or Y direction) may be smaller than a width W2 of the upper surface T of the deep via contact DV in the horizontal direction. Also, a sidewall SW of the deep via contact DV may be inclined with respect to the vertical direction (Z direction) (see FIG. 2A). Accordingly, a width of the deep via contact DV in a horizontal direction may be gradually reduced toward the substrate 110 in a length direction from the upper surface T to the lower surface B thereof. The deep via contact DV may therefore form a tapered shape. Also, an area of the lower surface B of the deep via contact DV that abuts on the first contact CA or the second contact CB may be smaller than an area of the upper surface T of the deep via contact DV that abuts on the second unilateral wiring layer M2.

A horizontal distance HL1 between one of the first unidirectional wiring layers M1 that is closest to the deep via contact DV and the deep via contact DV at the second level (see FIG. 2C) may remain large enough so as not to violate the minimum spacing rule. Similarly, a horizontal distance between one of the lower via contacts V0 that is closest to the deep via contact DV and the deep via contact DV may also remain large enough so as not to violate the minimum spacing rule.

In the logic cell 100A illustrated in FIGS. 2A through 2D, the first unidirectional wiring layers M1 and the second unidirectional wiring layers M2 may be a portion of a multi-layer wiring structure included in the logic cell 100A. The multi-layer wiring structure may include wiring layers that are at multiple levels which are respectively at different vertical distances from the substrate 110, and may further include wiring layers that are formed at a level such that they are at a greater distance from the substrate 110 than the second unidirectional wiring layer M2. In certain embodiments, within a particular area of the logic cell 100, a first wiring layer (e.g., M1) includes only unidirectional wires (also referred to as unidirectional lines or unidirectional wiring lines), and a second wiring layer (e.g., M2) includes only unidirectional wires. As such, the term "wiring layer" may be used herein in certain instances to refer to one of the wiring lines at a particular vertical level, and in other instances to refer to a set of wires or wiring lines disposed at a particular vertical level. The unidirectional wires at the first wiring layer M1 within the particular area may be formed only in a first direction, and unidirectional wires at the second wiring layer M2 within the particular area may be formed only in a second direction different from the first direction. For example, the second direction may be orthogonal to the first direction. Within the particular area of the logic cell 100 certain of the unidirectional wires from the first wiring layer M1 may connect to certain of the unidirectional wires from the second wiring layer M2 via conductive contacts disposed vertically between the first wiring layer M1 and second wiring layer M2. Also, certain vertical contacts, such as a deep via contact, may connect from a second wiring layer M2, which may be an upper wiring layer, to a level lower than the first wiring layer M1, to connect, for example, to a gate line disposed at a lower level than the first wiring layer M1. The vertical contacts may also be described herein as conductive vias.

Figure 3:
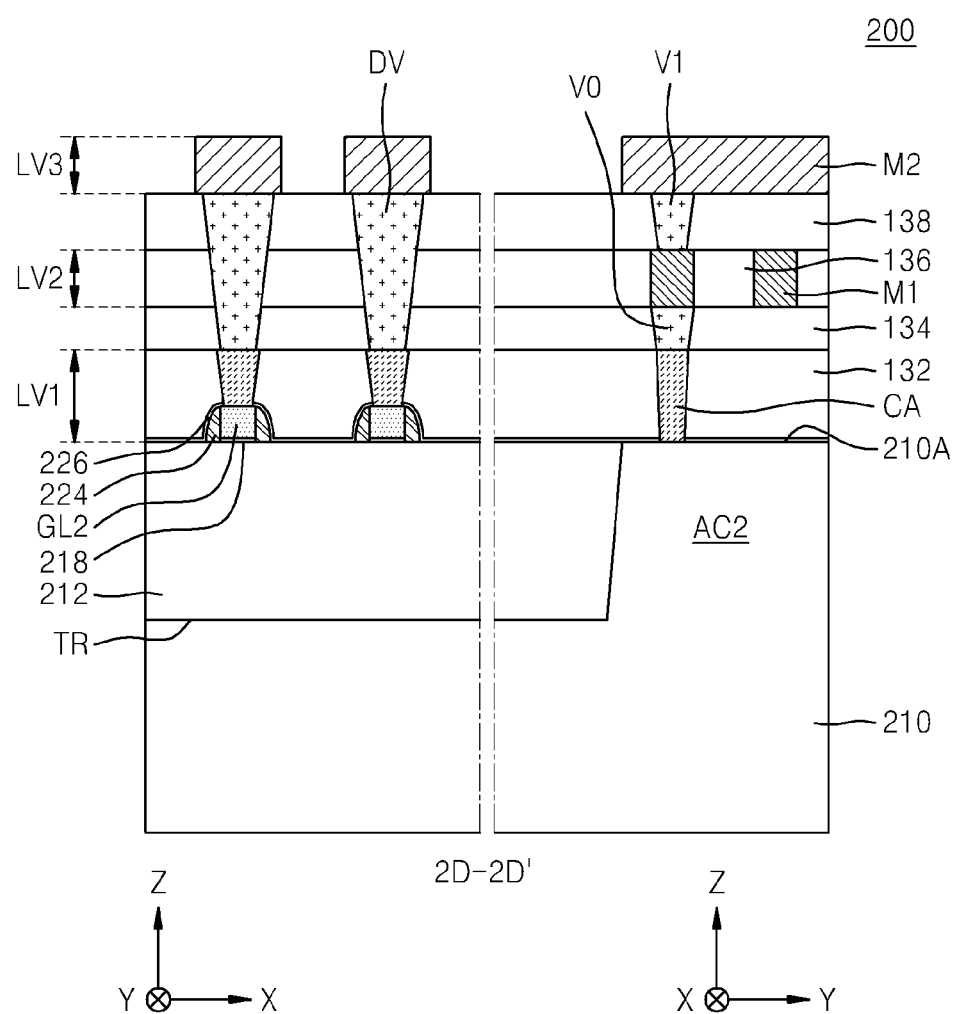
FIG. 3 is a cross-sectional view of a logic cell according to embodiments of the inventive concept.

FIG. 3 is a cross-sectional view of a logic cell 200 according to embodiments of the inventive concept.

FIG. 3 is a cross-sectional view of a logic cell that may have the same or similar layout as the logic cell 100 of FIG. 1, illustrating a portion of the logic cell 200 including a metal oxide semiconductor field effect transistor (MOSFET) formed on a substrate 210 which is a bulk substrate. The logic cell 200 illustrated in FIG. 3 may have the same or similar layout as that illustrated in FIG. 1 except for structures of the substrate 210, a gate insulation layer 218, and gate line GL2.

Referring to FIG. 3, the logic cell 200 includes the substrate 210 having a main surface 210A that extends in a horizontal direction (X direction and Y direction in FIGS. 1 and 3). The substrate 210 includes a logic cell area LC as illustrated in FIG. 1.

In some embodiments, the substrate 210 may include a semiconductor such as Si or Ge or a compound semiconductor such as SiGe, SiC, GaAs, InAs, or InP. According to another embodiment, the substrate 210 may have a silicon on insulator (SOI) structure. The substrate 210 may include a conductive area such as an impurity-doped well or an impurity-doped structure.

A device isolation layer 212 is formed in a trench TR formed in the substrate 210 to define an active area AC2 on a surface of the substrate 210. The active area AC2 includes a first device area RX1 and a second device area RX2 as illustrated in FIG. 1.

A plurality of gate insulation layers 218 and a plurality of gate lines GL2 extend on the active area AC2 and the device isolation layer 212 on the substrate 210 in a direction of a height LCH of the logic cell area LC.

The plurality of gate insulation layers 218 and the plurality of gate lines GL2 are formed of materials that are approximately similar to those described with respect to the gate insulation layers 118 and the gate lines GL described with reference to FIGS. 1 through 2D.

Two sidewalls of the gate lines GL2 may be each covered with an insulation spacer 224. The insulation spacer 224 may be formed of an oxide layer, a nitride layer, or a combination of these, but is not limited thereto. An upper surface of the gate lines GL2 and an upper surface of the substrate 210 may be covered with an insulation capping layer 226. The insulation capping layer 226 may be formed of a nitride layer, but is not limited thereto.

The second unidirectional wiring layers M2 may be connected to the gate lines GL2 through a deep via contact DV and a second contact CB. Also, although not illustrated in the drawing, the second unidirectional wiring layers M2 may be connected to a portion selected from the active area AC2 through the deep via contact DV. Also, as shown in FIG. 3, the height of the gate lines GL2 may be smaller than the height of the gate lines GL in FIG. 2D.

Figure 4:
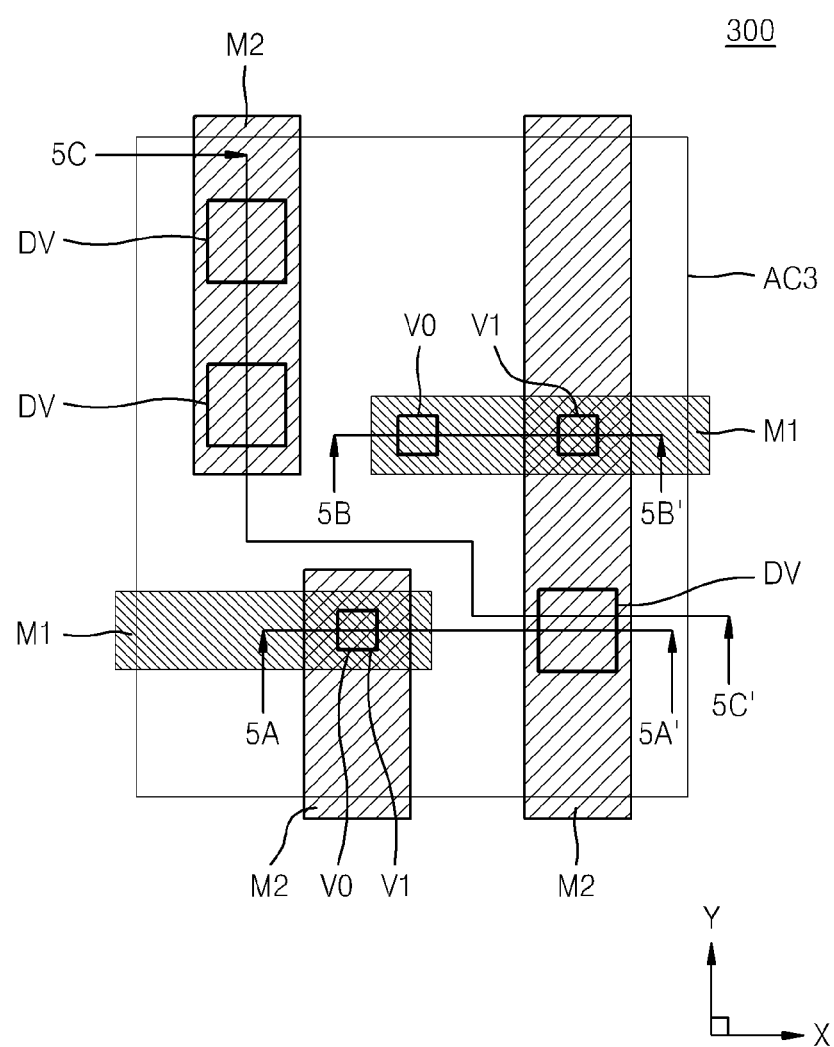
FIG. 4 is a layout diagram of a logic cell according to embodiments of the inventive concept.
Figure 5A:
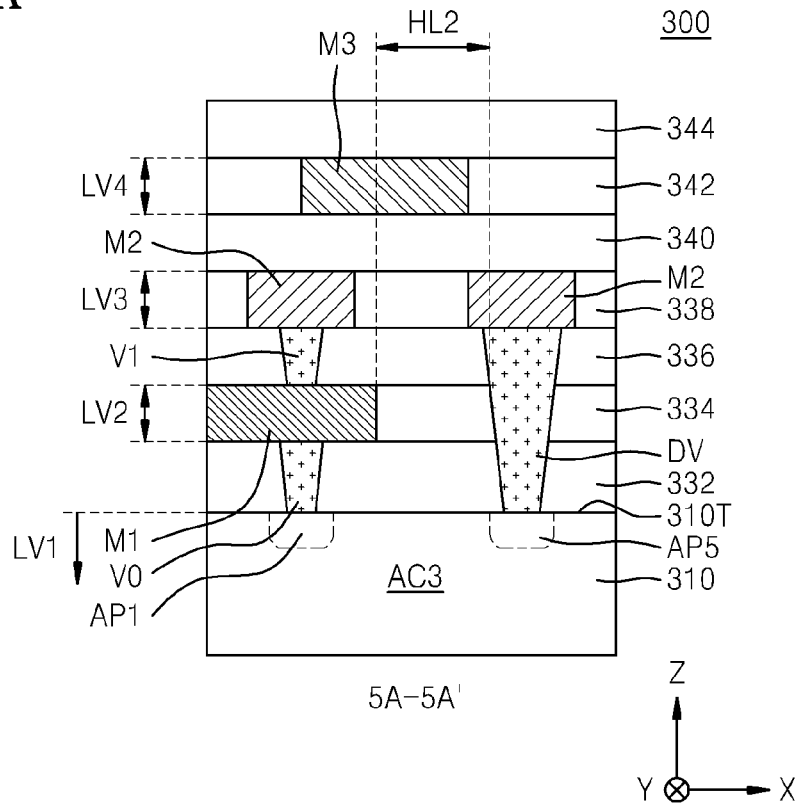
FIG. 5A is an exemplary cross-sectional view of the logic cell of FIG. 4 cut along a line 5A-5A'.
Figure 5B:
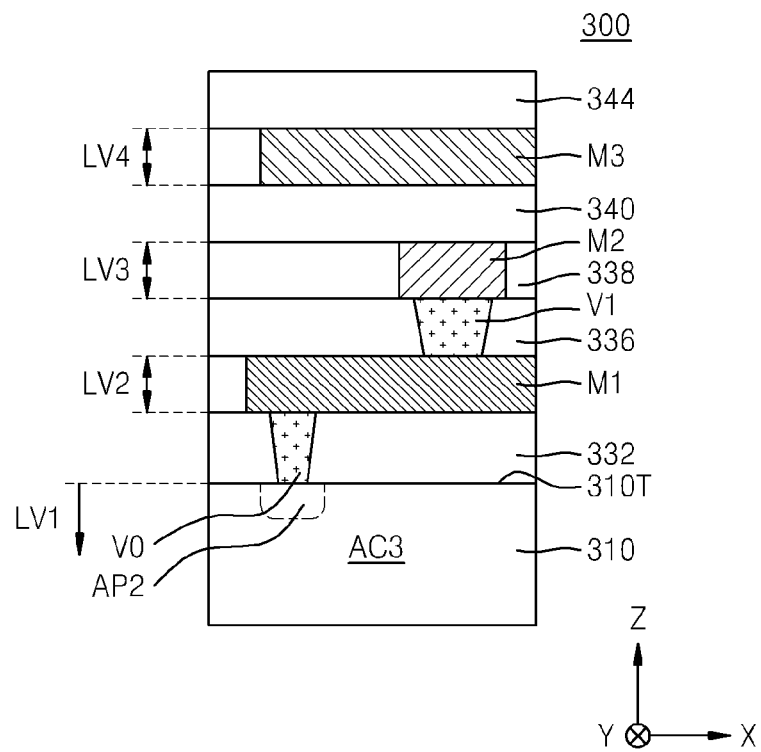
FIG. 5B is an exemplary cross-sectional view of the logic cell of FIG. 4 cut along a line 5B-5B'.
Figure 5C:
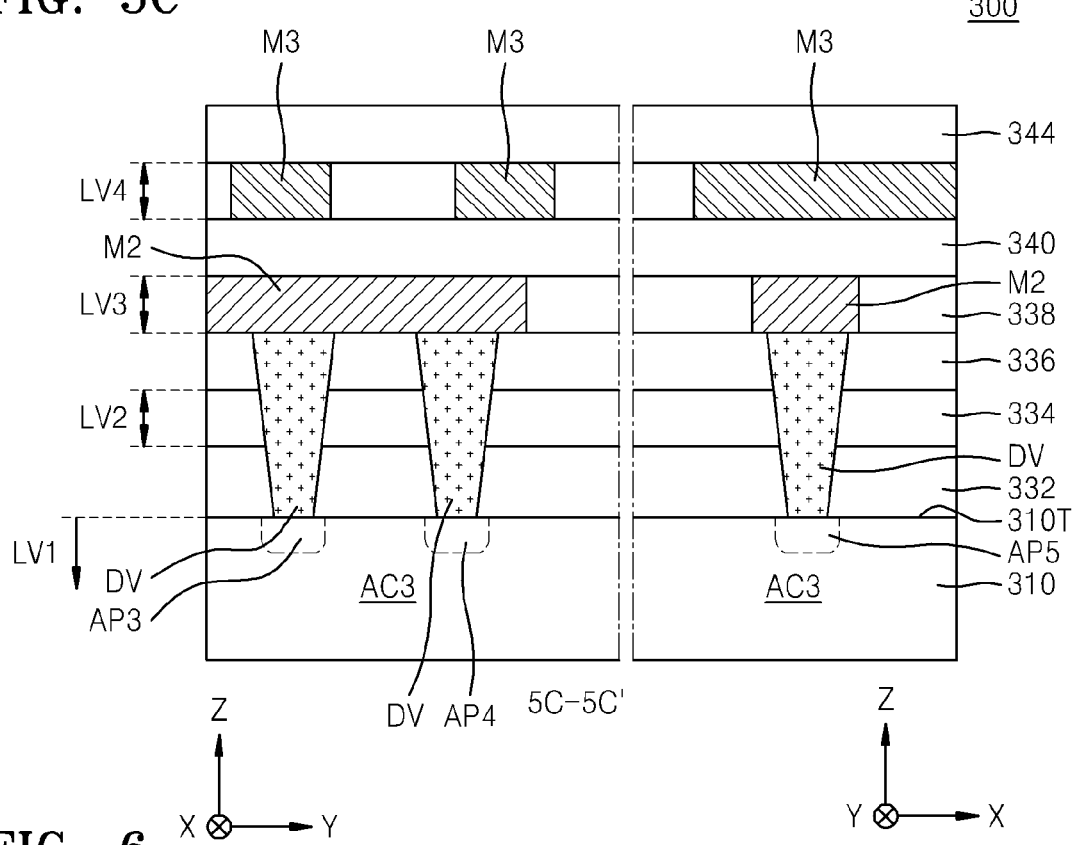
FIG. 5C is an exemplary cross-sectional view of the logic cell of FIG. 4 cut along a line 5C-5C'.

FIG. 4 is a layout diagram of a logic cell 300 according to embodiments of the inventive concept. FIG. 5A is a cross-sectional view of the logic cell of FIG. 4 cut along a line 5A-5A'. FIG. 5B is a cross-sectional view of the logic cell of FIG. 4 cut along a line 5B-5B'. FIG. 5C is a cross-sectional view of the logic cell of FIG. 4 cut along a line 5C-5C'. In FIGS. 4 through 5C, like reference numerals as in FIGS. 1 through 2D denote like elements and detailed description thereof will be omitted.

Referring to FIGS. 4 through 5C, the logic cell 300 includes an active area AC3 that is exposed on a surface of a substrate 310.

In some embodiments, the active area AC3 formed at the first level LV1 on the substrate 310 may be formed of a fin-type active area that has a similar shape as the plurality of fin-type active areas AC illustrated in FIGS. 2A through 2D. In some other embodiments, the substrate 310 may have the same structure as the substrate 210 illustrated in FIG. 3 which is a bulk substrate, and the active area AC3 may be defined in the substrate 310 by using a trench device isolation process like the active area AC2 illustrated in FIG. 3. A planar shape of the active area AC3 is not limited as illustrated in FIG. 4 and may have various planar shapes according to required designs.

The substrate 310 may have a structure like the substrate 110 described with reference to FIG. 1 or the substrate 210 described with reference to FIG. 3.

In the logic cell 300, some of the plurality of lower via contacts V0 are directly connected to portions AP1 and AP2 selected from the active area AC3 exposed on an upper surface 310T of the substrate 310. Some of the plurality of deep via contacts DV are directly connected to portions AP3, AP4, and AP5 selected from the active area AC3 exposed on the upper surface 310T of the substrate 310.

In a portion of the logic cell 300, the second unidirectional wiring layers M2 may be directly connected to the portions AP3, AP4, and AP5 selected from the active area AC3 through a deep via contact DV. According to one embodiment, the deep via contact DV may extend from one of the second unidirectional wiring layers M2 through the first through third interlayer insulation layers 332, 334, and 336 up to one of the portions AP3, AP4, and AP5 selected from the active areas AC3.

In another portion of the logic cell 300, the second unidirectional wiring layers M2 may be connected to one of the first unidirectional wiring layers M1 via one of a plurality of upper via contacts V1 formed between the second level LV2 and the third level LV3. The upper via contacts V1 may pass through the third interlayer insulation layer 336 to be connected to one of the first unidirectional wiring layers M1.

A horizontal width of the deep via contact DV may be gradually reduced toward the substrate 310 along a length direction from an upper surface to a bottom surface thereof. Thus, even when a wiring pitch is reduced, a horizontal distance HL2 between one of the first unidirectional wiring layers M1 that is closest to the deep via contact DV and the deep via contact DV (see FIG. 5A) may remain large enough so as not to violate the minimum spacing rule. Similarly, a horizontal distance between one of the lower via contacts V0 that is closest to the deep via contact DV and the deep via contact DV may also remain large enough so as not to violate the minimum spacing rule.

As illustrated in FIGS. 5A through 5C, the logic cell 300 may further include a fourth interlayer insulation layer 340 that covers the second unidirectional wiring layers M2, a plurality of third wiring layers M3 that are formed on the fourth interlayer insulation layer 340, a fifth interlayer insulation layer 342 that insulates the plurality of third wiring layers M3 from one another, and a sixth interlayer insulation layer 344 that covers the third wiring layers M3 and the fifth interlayer insulation layer 342. In one embodiment, details of materials of the first through sixth interlayer insulation layers 332, 334, 336, 338, 340, 342, and 344 is the same as the description of materials described with respect to the first through fourth interlayer insulation layers 132, 134, 136, and 138 with reference to FIGS. 1 through 2D.

The logic cell 300 may include a multi-layer wiring structure including wirings layers that are at multiple levels which are at different distances from the substrate 310. The first unidirectional wiring layers M1, the second unidirectional wiring layers M2, and the third unidirectional wiring layers M3 may be each a portion of a multi-layer wiring structure that is included in the logic cell 300.

Figure 6:
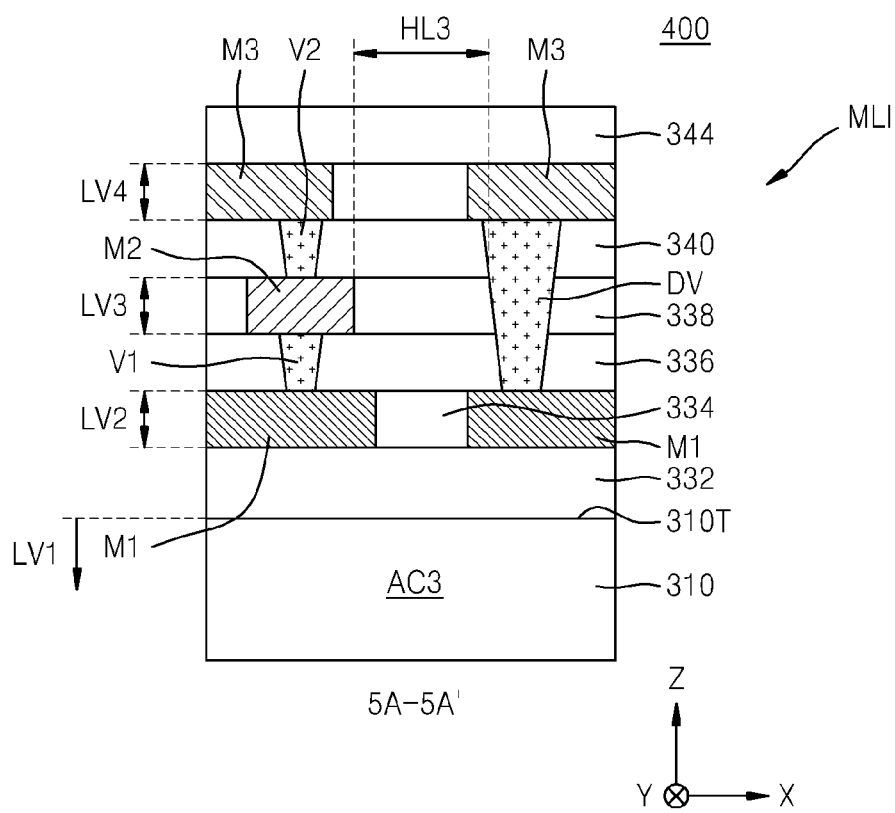
FIG. 6 is a cross-sectional view of a logic cell according to embodiments of the inventive concept.

FIG. 6 is a cross-sectional view of a logic cell 400 according to certain embodiments of the inventive concept. Referring to FIG. 6, a multi-layer structure MLI that forms the logic cell 400 and includes a deep via contact DV will be described. In FIG. 6, like reference numerals as those in FIGS. 4 through 5C denote like elements and detailed description thereof will be omitted.

Referring to FIG. 6, in a portion of the logic cell 400, at least one selected from the plurality of third wiring layers M3 may be connected to one of a plurality of first unidirectional wiring layers M1 through the deep via contact DV. The third wiring layers M3 may be formed of a plurality of unidirectional wiring layers that extend in a horizontal direction and in parallel to one another and cross a plurality of second unidirectional wiring layers M2.

In another portion of the logic cell 400, the second unidirectional wiring layer M2 may be connected to one of the first unidirectional wiring layers M1 through an upper via contact V1 formed between a second level LV2 and a third level LV3. Also, one of the third wiring layers M3 may be connected to one of the second unidirectional wiring layers M2 through a via contact V2 formed between a third level LV3 and a fourth level LV4.

A width of the deep via contact DV in a horizontal direction may be gradually reduced toward the substrate 310 along a length direction from an upper surface to a bottom surface thereof. Thus, even when a wiring pitch is reduced, a horizontal distance HL3 between one of the second unidirectional wiring layers M2 that is closest to the deep via contact DV and the deep via contact DV may remain large enough so as not to violate the minimum spacing rule. Similarly, a horizontal distance between one of the first unidirectional wiring layers M1 that is closest to the deep via contact DV and the deep via contact DV may remain large enough so as not to violate the minimum spacing rule.

Figure 7:
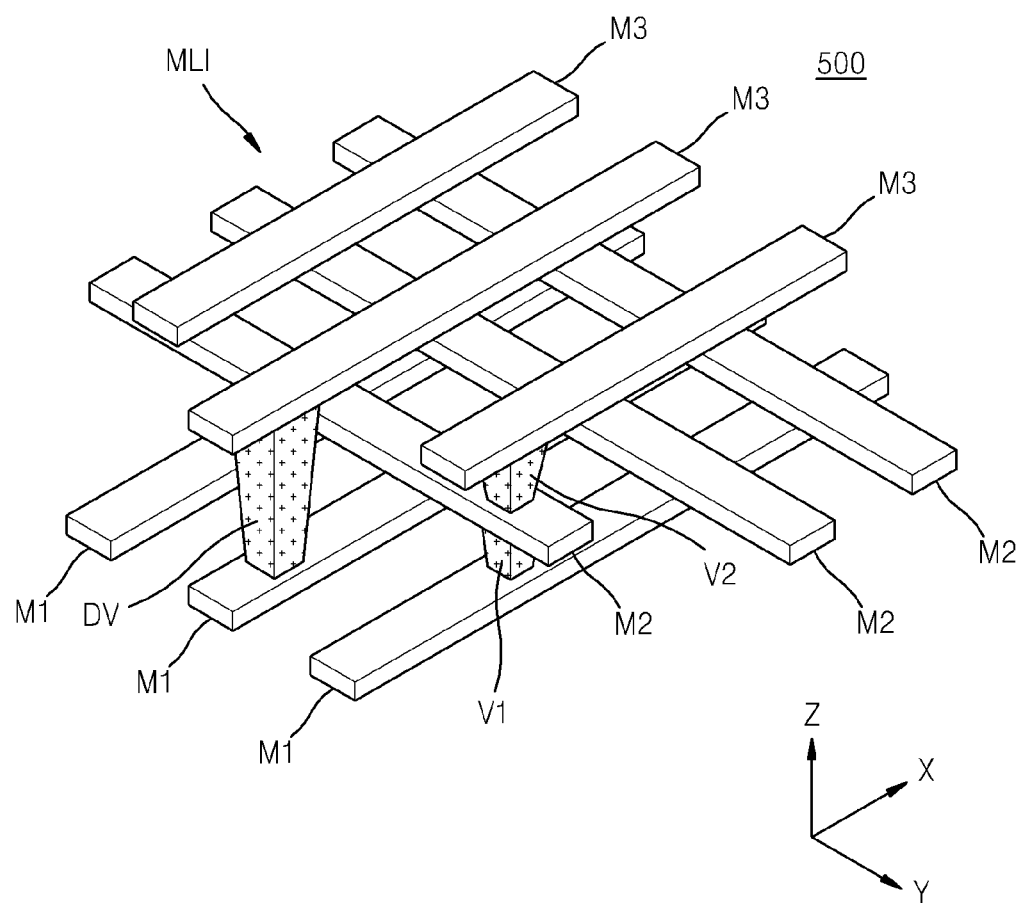
FIG. 7 is a perspective view illustrating a portion of a multi-layer wiring structure of a logic cell according to embodiments of the inventive concept.

FIG. 7 is a perspective view illustrating a portion of a multi-layer wiring structure of a logic cell 500 according to embodiments of the inventive concept. In FIG. 7, like reference numerals as in FIG. 4 through 6 denote like elements and detailed description thereof will be omitted.

In FIG. 7, a plurality of first unidirectional wiring layers M1, a plurality of second unidirectional wiring layers M2, and a plurality of third unidirectional wiring layers M3 that form a multi-layer wiring structure MLI are illustrated.

As illustrated in FIG. 7, the first unidirectional wiring layers M1 may extend in parallel to one another in a first horizontal direction (for example, X direction in FIG. 7) at the second level LV2 which is higher than the first level LV1 at which the active area AC3 of the substrate 310 is formed.

The second unidirectional wiring layers M2 may extend in parallel to one another in a second horizontal direction that crosses the first horizontal direction (for example, Y direction in FIG. 7) at the third level LV3 which is higher than the second level LV2 at which the first unidirectional wiring layers M1 are formed.

The third wiring layers M3 may extend in parallel to one another in a third horizontal direction that crosses the second horizontal direction at the fourth level LV4 which is higher than the third level LV3 at which the second unidirectional wiring layers M2 are formed. According to an embodiment, the third horizontal direction may be the same as the first horizontal direction. According to another embodiment, the third horizontal direction may be different from the first horizontal direction.

Figure 8A:
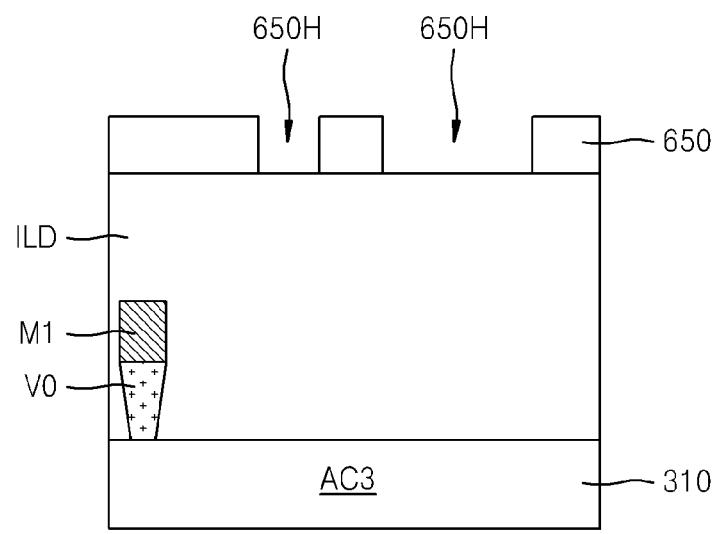
FIGS. 8A through 8G are cross-sectional views illustrating a method of manufacturing a logic cell according to a process order according to embodiments of the inventive concept.
Figure 8B:
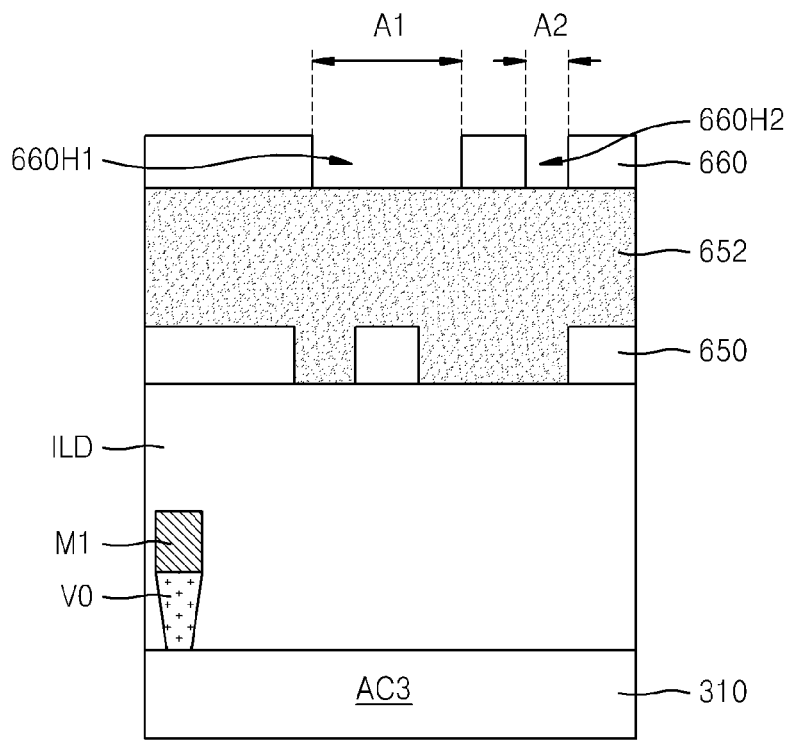
Figure 8C:
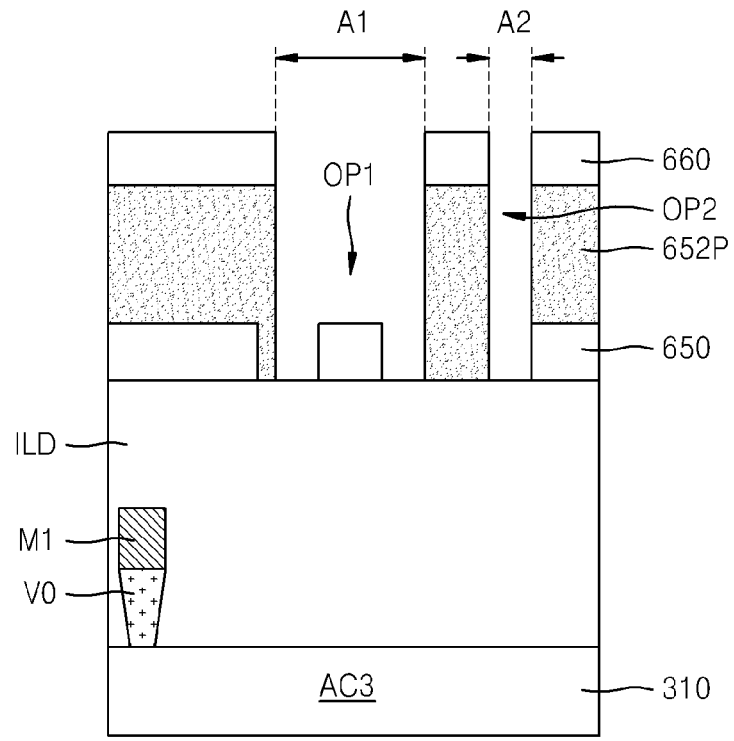
Figure 8D:
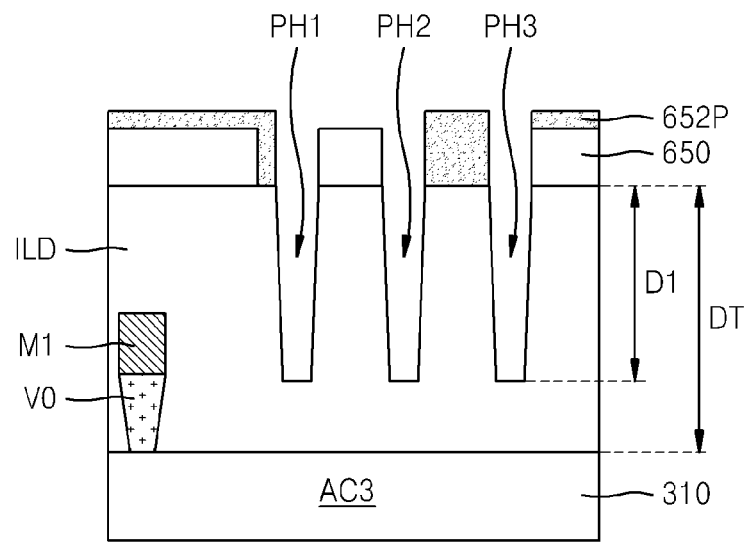
Figure 8E:
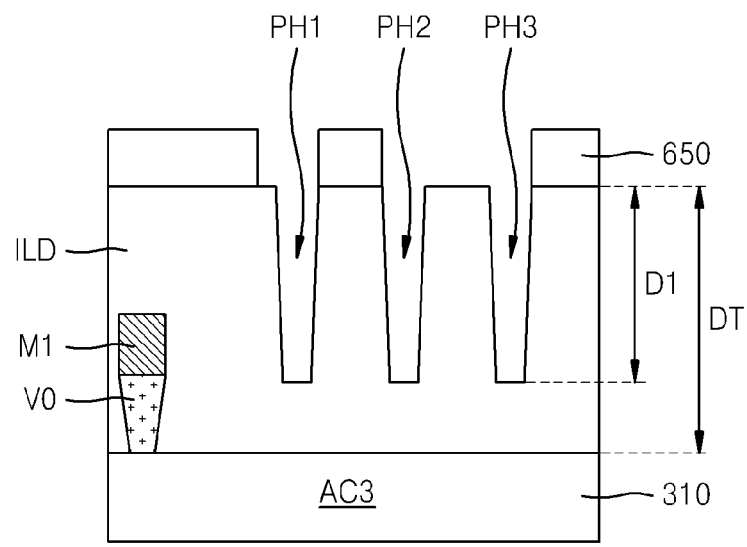
Figure 8F:
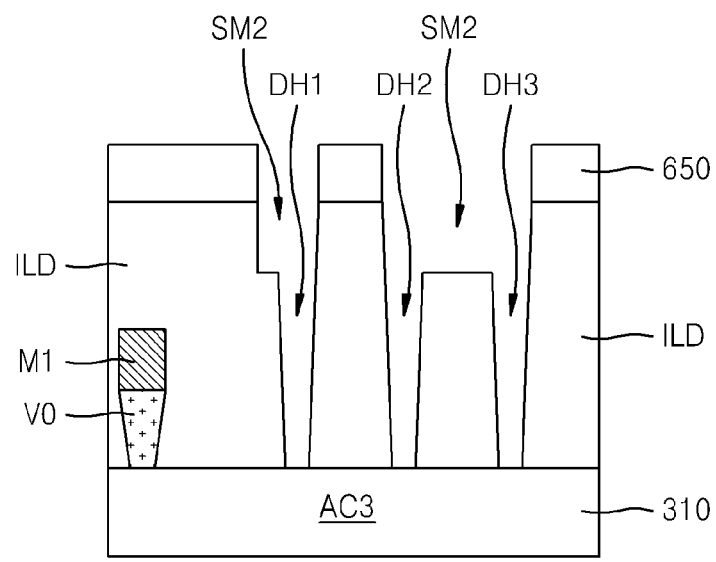
Figure 8G:
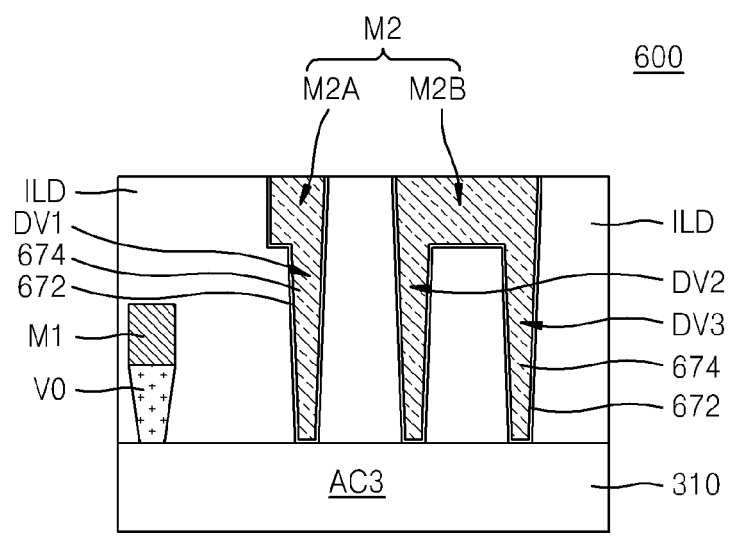
Figure 9:
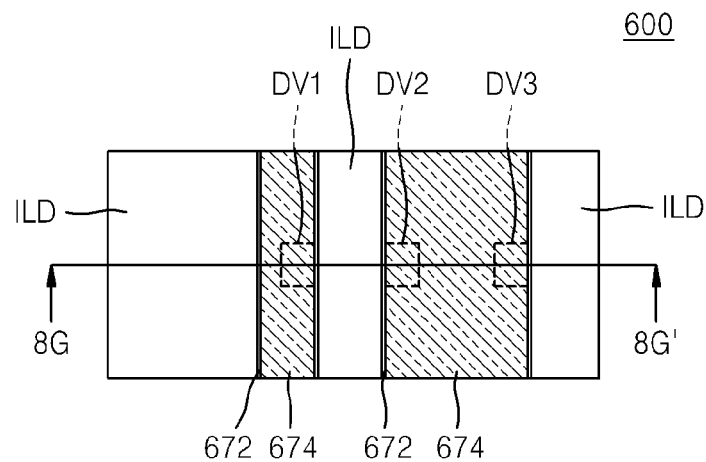
FIG. 9 is a plan view illustrating an exemplary planar structure that a logic cell illustrated in FIG. 8G may have.

FIGS. 8A through 8G are cross-sectional views illustrating a method of manufacturing a logic cell 600 according to a process order according to embodiments of the inventive concept (see FIGS. 8G and 9). In FIGS. 8A through 8G, like reference numerals as those of FIGS. 1 through 7 denote like elements and detailed description thereof will be omitted.

Referring to FIG. 8A, a lower via contact V0 and a first unidirectional wiring layer M1 are formed on a substrate 310.

The first unidirectional wiring layer M1 may be connected to the active area AC3 of the substrate 310 through the lower via contact V0.

Then, although not shown in FIGS. 8A-8G, an upper via contact V1 as illustrated in FIGS. 5A and 5B may be formed on the first unidirectional wiring layer M1.

When forming the lower via contact V0, the first unidirectional wiring layer M1, and the upper via contact V1, a plurality of interlayer insulation layers may be formed. Thus, an interlayer insulation layer ILD that covers a resultant product including the lower via contact V0, the first unidirectional wiring layer M1, and the upper via contact V1 may be formed.

The interlayer insulation layer ILD may include at least some of the first through fourth interlayer insulation layers 132, 134, 136, and 138 illustrated in FIGS. 2A through 2D or at least some of the first through third interlayer insulation layers 332, 334, and 336 illustrated in FIGS. 5A through 5C.

A first hard mask pattern 650 is formed on the interlayer insulation layer ILD.

When the interlayer insulation layer ILD is formed of an oxide layer, the first hard mask pattern 650 may be formed of a nitride layer or a polysilicon layer, but is not limited thereto.

A plurality of holes 650H that define an area, in which the second unidirectional wiring layers M2 are to be formed in a subsequent operation, are formed in the first hard mask pattern 650.

Referring to FIG. 8B, a sacrificial layer 652 is formed on a resultant product including the first hard mask pattern 650.

The sacrificial layer 652 may be formed of the same material as a material of the interlayer insulation layer ILD or a material that has an etching selectivity which is the same as or similar to that of a material of the interlayer insulation layer ILD. For example, the sacrificial layer 652 may be formed of an oxide layer.

A second hard mask pattern 660 is formed on the sacrificial layer 652.

The second hard mask pattern 660 may be formed of the same material as the first hard mask pattern 650 or may be formed of a material that has an etching selectivity which is the same as or similar to that of a material of the first hard mask pattern 650. For example, the second hard mask pattern 660 may be formed of a nitride layer or a polysilicon layer, but is not limited thereto.

A plurality of holes 660H1 and 660H2 that define an area, in which a plurality of deep via contacts DV are to be formed in a subsequent operation, are formed in the second hard mask pattern 660. In a subsequent operation, a plurality of deep via contacts DV may be formed in a first area A1 that is defined on the substrate 310 by holes, such as the hole 660H1, from among the plurality of holes 660H1 and 660H2. A single deep via contact DV may be formed in a subsequent operation in a second area A2 that is defined on the substrate 310 by other holes, such as the hole 660H2, from among the plurality of holes 660H1 and 660H2.

Referring to FIG. 8C, the second hard mask pattern 660 is used as an etching mask to anisotropically etch the sacrificial layer 652, thereby forming a sacrificial pattern 652P in which a plurality of openings OP1 and OP2 are formed.

An upper surface of the first hard mask pattern 650 and an upper surface of the interlayer insulation layer ILD may be exposed through an opening OP1 included in the first area A1 on the substrate 310 from among a plurality of openings OP1 and OP2 formed in the sacrificial pattern 652P.

The first hard mask pattern 650 may not be exposed, while the upper surface of the interlayer insulation layer ILD may be exposed through the opening OP2 included in the second area A2 on the substrate 310 from among the plurality of openings OP1 and OP2 formed in the sacrificial pattern 652P.

Referring to FIG. 8D, by using the second hard mask pattern 660 and the first hard mask pattern 650 that is exposed through the opening OP1 included in the first area A1 as an etching mask, the interlayer insulation layer ILD that is exposed through the plurality of openings OP1 and OP2 is partially anisotropically etched to a depth D1 that is smaller than a total thickness DT of the interlayer insulation layer ILD, thereby forming a plurality of preliminary holes PH1, PH2, and PH3 in the interlayer insulation layer ILD.

While the plurality of preliminary holes PH1, PH2, and PH3 are formed in the interlayer insulation layer ILD, at least a portion of the second hard mask pattern 660 and the sacrificial pattern 652P which are used as an etching mask may be consumed.

Referring to FIG. 8E, a remaining portion of the sacrificial pattern 652P illustrated in FIG. 8D may be removed from a resultant product illustrated in FIG. 8D, in which the plurality of preliminary holes PH1, PH2, and PH3 having a depth D1 are formed, to again expose a portion of the upper surface of the first hard mask pattern 650 and the upper surface of the interlayer insulation layer ILD that have been covered by the sacrificial pattern 652P.

Referring to FIG. 8F, the first hard mask pattern 650 is used as an etching mask to etch the exposed portion of the interlayer insulation layer ILD, thereby forming a plurality of deep via holes DH1, DH2, and DH3 that extend from the plurality of preliminary holes PH1, PH2, and PH3 toward the substrate 310 and forming a plurality of wiring spaces SM2 that connect to the deep via holes DH1, DH2, and DH3 at an entrance of the deep via holes DH1, DH2, and DH3.

The plurality of wiring spaces SM2 may provide space in which the second unidirectional wiring layers M2 are to be formed in a subsequent operation.

Referring to FIG. 8G, the first hard mask pattern 650 (see FIG. 8F) is removed to expose the upper surface of the interlayer insulation layer ILD, and then, the deep via holes DH1, DH2, and DH3 and the plurality of wiring spaces SM2 are filled with a conductive material to form a plurality of deep via contacts DV1, DV2, and DV3 and a plurality of second unidirectional wiring layers M2.

The plurality of deep via contacts DV1, DV2, and DV3 and the second unidirectional wiring layers M2 may each include a conductive barrier layer 672 and a wiring layer 674.

In some embodiments, to form the plurality of deep via contacts DV1, DV2, and DV3 and the second unidirectional wiring layers M2, first, the conductive barrier layer 672 that covers inner walls of the deep via hole DH1, DH2, and DH3 and the plurality of wiring spaces SM2 and the upper surface of the interlayer insulation layer ILD is formed. Then, the wiring layer 674 having a sufficient thickness to fill the deep via holes DH1, DH2, and DH3 and the wiring spaces SM2 is formed on the conductive barrier layer 672. Then, unnecessary portions of the conductive barrier layer 672 and the wiring layer 674 are removed by using an etch back process, a chemical mechanical polishing (CMP) operation or a combination of these so that the conductive barrier layer 672 and the wiring layer 674 remain only in the deep via hole DH1, DH2, and DH3 and the wiring spaces SM2.

FIG. 9 is a plan view illustrating a planar structure that the logic cell 600 illustrated in FIG. 8G may have.

A cross-section of the logic cell 600 illustrated in FIG. 8G may correspond to a cross-sectional view of FIG. 9 cut along a line 8G-8G'. In FIG. 9, positions of the deep via contacts DV1, DV2, and DV3 are illustrated by a dotted line.

However, the planar structure of the logic cell 600 illustrated in FIG. 9 is exemplary, and the inventive concept is not limited to FIG. 9.

Referring to FIGS. 8G and 9, the second unidirectional wiring layers M2 include a second unidirectional wiring layer M2A that is integrally formed with the single deep via contact DV1 and a second unidirectional wiring layer M2B that is integrally formed with the deep via contacts DV2 and DV3.

The deep via contacts DV1, DV2, and DV3 and the second unidirectional wiring layers M2 having the structure illustrated in FIGS. 8G and 9 may form a portion of the logic cells according to the embodiments of the inventive concept.

In certain embodiments, the logic cells according to the embodiments of the inventive concept are standard cells that perform a logic function, such as a counter or a buffer, and may constitute various types of logic cells that include a plurality of circuit elements such as a transistor or a register. For example, a logic cell according to the inventive concept may constitute an AND gate, a NAND gate, an OR gate, a NOR gate, an XOR (exclusive OR) gate, an XNOR (exclusive NOR) gate, an INV (inverter), an ADD (adder), a BUF (buffer) cell, a DLY (delay) cell, a FILL (filter), a multiplexer (MXT/MXIT), an OAI (OR/AND/INVERTER) complex gate, an AO (AND/OR) complex gate, an AOI (AND/OR/INVERTER) complex gate, a D flip-flop, a reset flip-flop, a master-slave flip-flop, or a latch. However, the cells described above are exemplary, and the logic cells according to the inventive concept are not limited to the exemplary cells.

Figure 10A:
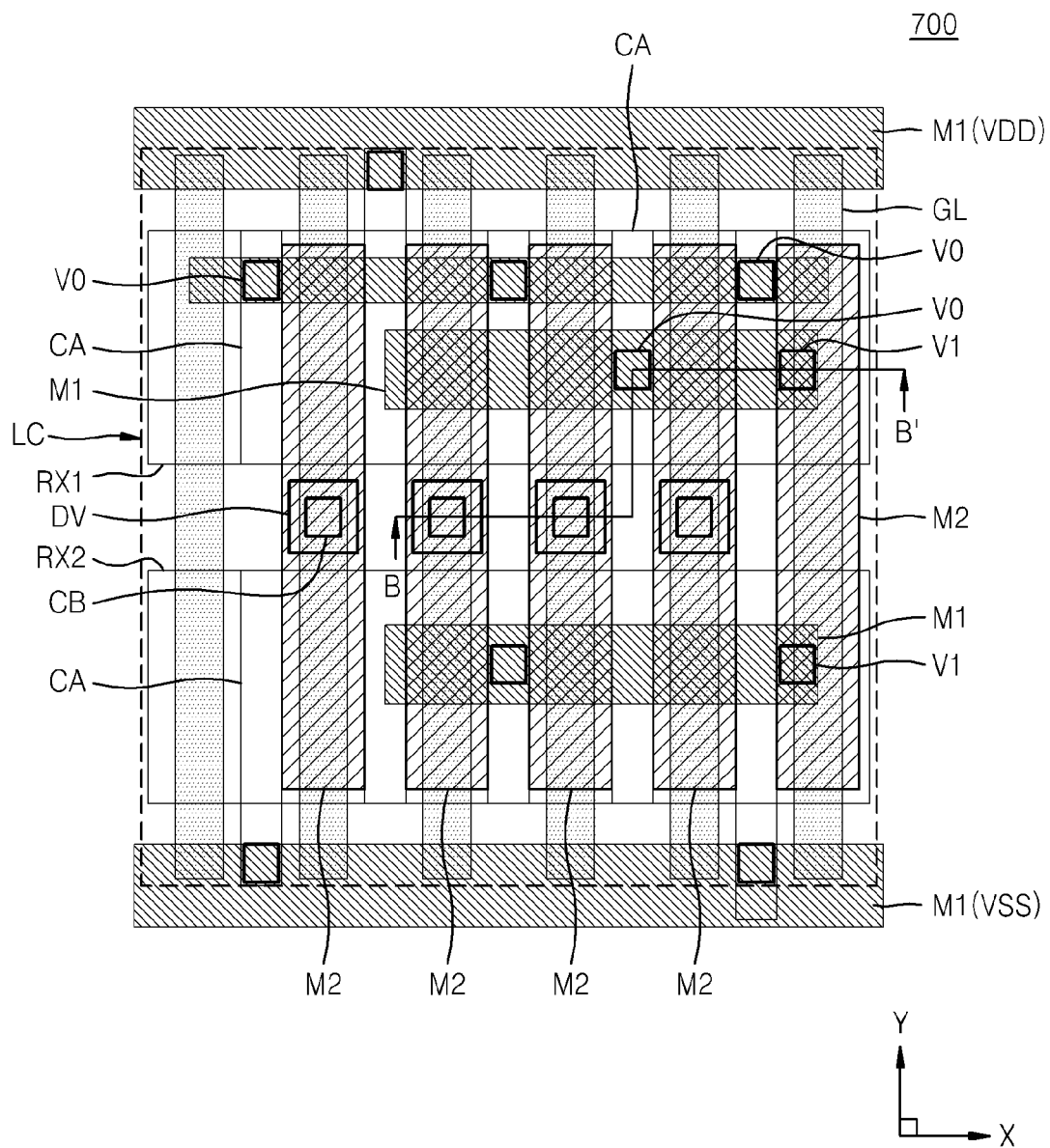
FIG. 10A is a layout diagram of a logic cell according to embodiments of the inventive concept.
Figure 10B:
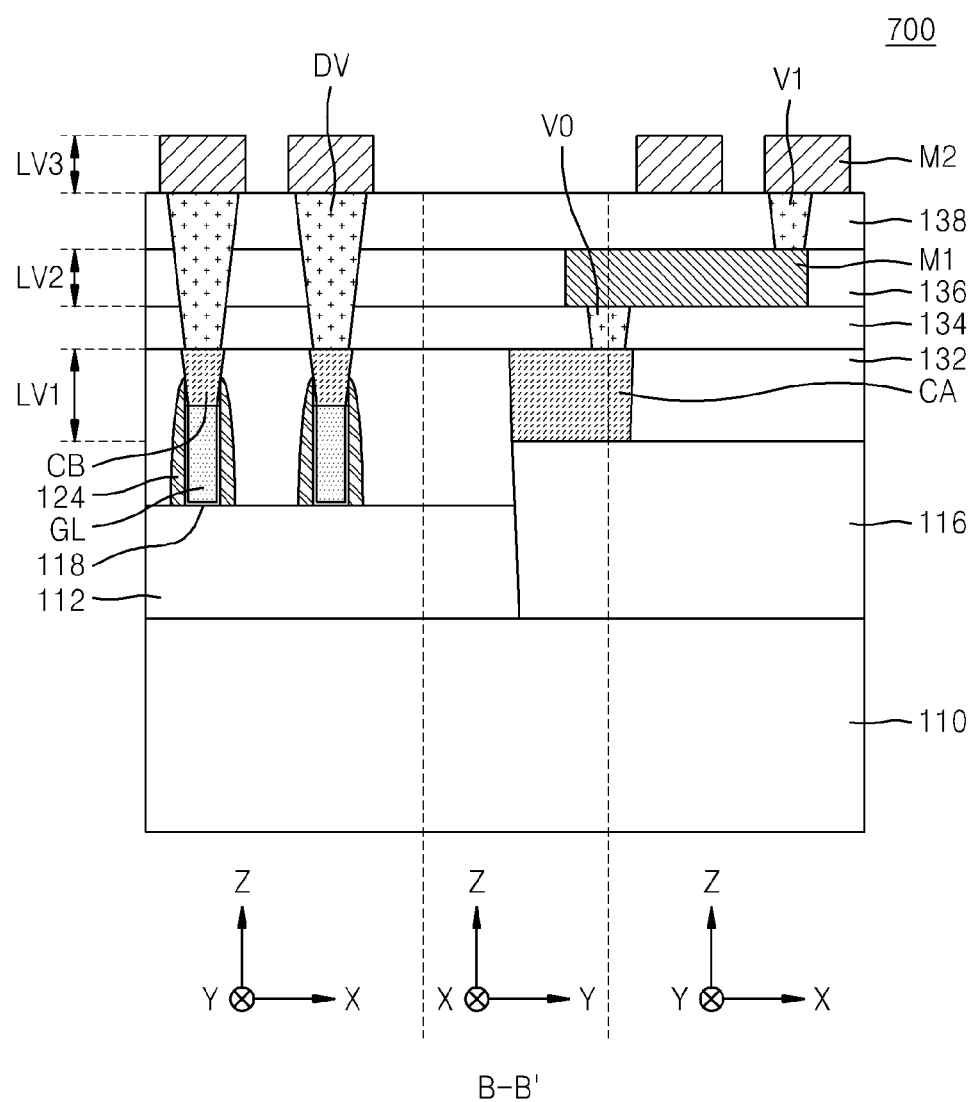
FIG. 10B is an exemplary cross-sectional view of the logic cell of FIG. 10A cut along a line B-B'.

FIG. 10A is a layout diagram of a logic cell 700 according to certain embodiments of the inventive concept. FIG. 10B is a cross-sectional view of the logic cell 700 of FIG. 10A cut along a line B-B'.

FIGS. 10A and 10B illustrate a layout of an AOI (AND/OR/INVERT) complex gate. In FIGS. 10A and 10B, like reference numerals as those in FIGS. 1 through 9 denote like elements, and detailed description thereof will be omitted.

Referring to FIGS. 10A and 10B, in the logic cell 700, a plurality of lower via contacts V0 are connected to a plurality of first contacts CA connected to the source/drain area 116 or a second contact CB connected to the gate lines GL, from among active areas formed in the first device area RX1 and the second device area RX2.

In a portion of the logic cell 700, a plurality of deep via contacts DV extend vertically from a plurality of second contacts CB, through the second through fourth interlayer insulation layers 134, 136, and 138, up to the second unidirectional wiring layers M2. The second unidirectional wiring layers M2 are connected to the second contact CB through the deep via contacts DV.

In another portion of the logic cell 700, the second unidirectional wiring layers M2 are connected to one of the first unidirectional wiring layers M1 through one of the upper via contacts V1 formed between the second level LV2 and the third level LV3. The upper via contacts V1 pass through the fourth interlayer insulation layer 138 and extend up to one of the first unidirectional wiring layers M1.

A width of the deep via contact DV in a horizontal direction may be gradually reduced toward the substrate 110 along a length direction from an upper surface to a bottom surface thereof. Thus, even when a wiring pitch is reduced, a horizontal distance between one of the first unidirectional wiring layers M1 that is closest to the deep via contact DV and the deep via contact DV may remain large enough so as not to violate the minimum spacing rule. Similarly, a horizontal distance between one of the lower via contacts V0 that is closest to the deep via contact DV and the deep via contact DV may remain large enough so as not to violate the minimum spacing rule.

Figure 11A:
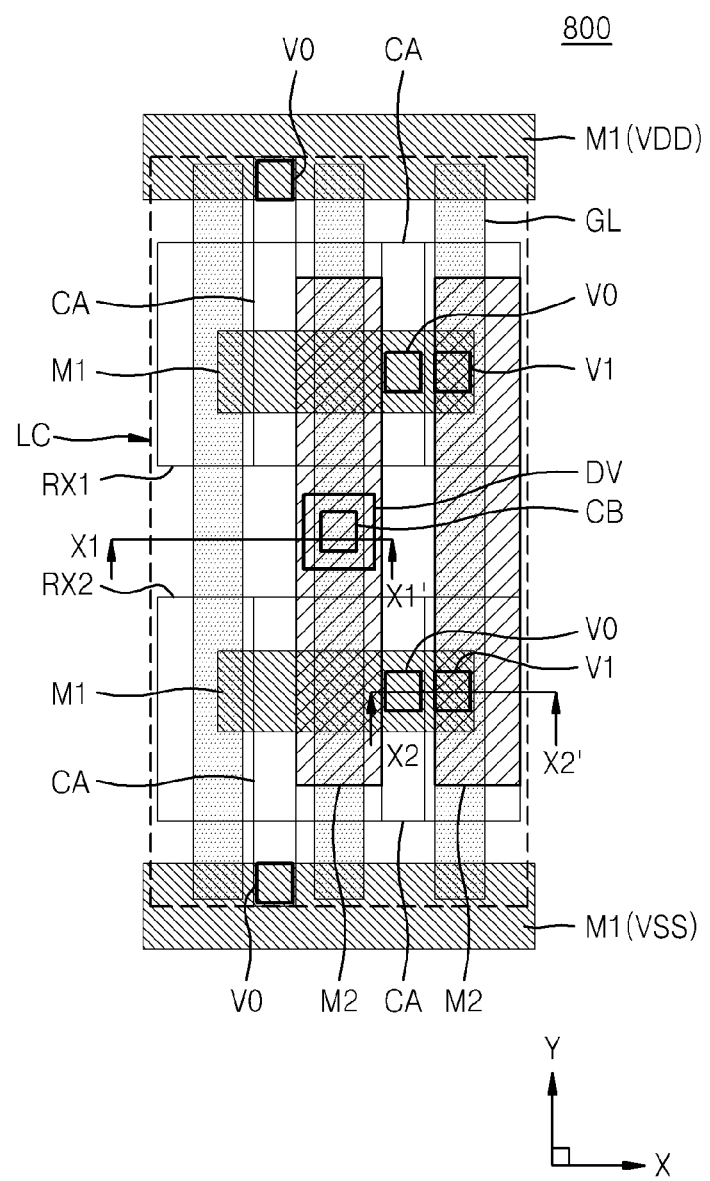
FIG. 11A is a layout diagram of a logic cell according to embodiments of the inventive concept.
Figure 11B:
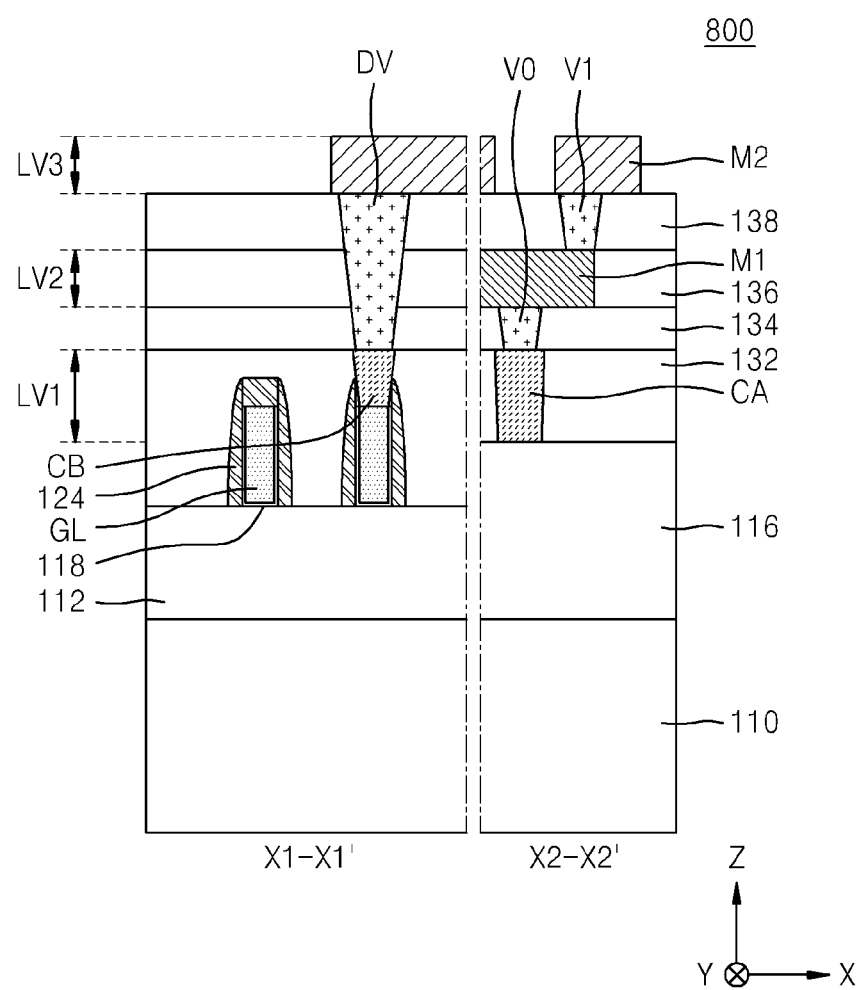
FIG. 11B is an exemplary cross-sectional view of the logic cell of FIG. 11A cut along a line X1-X1' and a line X2-X2'.

FIG. 11A is a layout diagram of a logic cell 800 according to certain embodiments of the inventive concept. FIG. 11B is a cross-sectional view of the logic cell 800 of FIG. 11A cut along a line X1-X1' and a line X2-X2'.

FIGS. 11A and 11B illustrate a layout of an inverter. In FIGS. 11A and 11B, like reference numerals as those in FIGS. 1 through 9 denote like elements, and detailed description thereof will be omitted.

Referring to FIGS. 11A and 11B, in the logic cell 800, a plurality of lower via contacts V0 are connected to a plurality of first contacts CA connected to the source/drain area 116 from among the active area AC.

In a portion of the logic cell 800, a plurality of deep via contacts DV extend from the plurality of second contacts CB, through the second through fourth interlayer insulation layers 134, 136, and 138, up to the second unidirectional wiring layers M2. The second unidirectional wiring layers M2 are connected to the second contact CB through the deep via contacts DV.

In another portion of the logic cell 800, the second unidirectional wiring layers M2 are connected to one of the first unidirectional wiring layers M1 through one of the upper via contacts V1 formed between the second level LV2 and the third level LV3. The upper via contacts V1 pass through the fourth interlayer insulation layer 138 and extend up to one of the first unidirectional wiring layers M1.

A width of the deep via contact DV in a horizontal direction may be gradually reduced toward the substrate 110 along a length direction from an upper surface to a bottom surface thereof. Thus, even when a wiring pitch is reduced, a horizontal distance between one of the first unidirectional wiring layers M1 that is closest to the deep via contact DV and the deep via contact DV may remain large enough so as not to violate the minimum spacing rule. Similarly, a horizontal distance between one of the lower via contacts V0 that is closest to the deep via contact DV and the deep via contact DV may remain large enough so as not to violate the minimum spacing rule.

While an AOI (AND/OR/INVERT) complex gate and an inverter are illustrated as examples of a logic cell according to the inventive concept in FIGS. 10A through 11B, the inventive concept is not limited thereto and may be applied to logic cells of various structures.

The via contacts described herein with reference to the above figures, may also be described herein as plugs, or via structures. As described herein, the via contacts described as "deep via contacts" pass through at least two layers of the interlayer insulating layers (e.g., are formed of a single, continuous material passing through these layers). The term single-layer via contact may be used to refer to a via contact that only passes through one interlayer insulating layer. In addition, two or more via contacts stacked on each other may be referred to collectively as a via contact, plug, or via structure.

Figure 12:
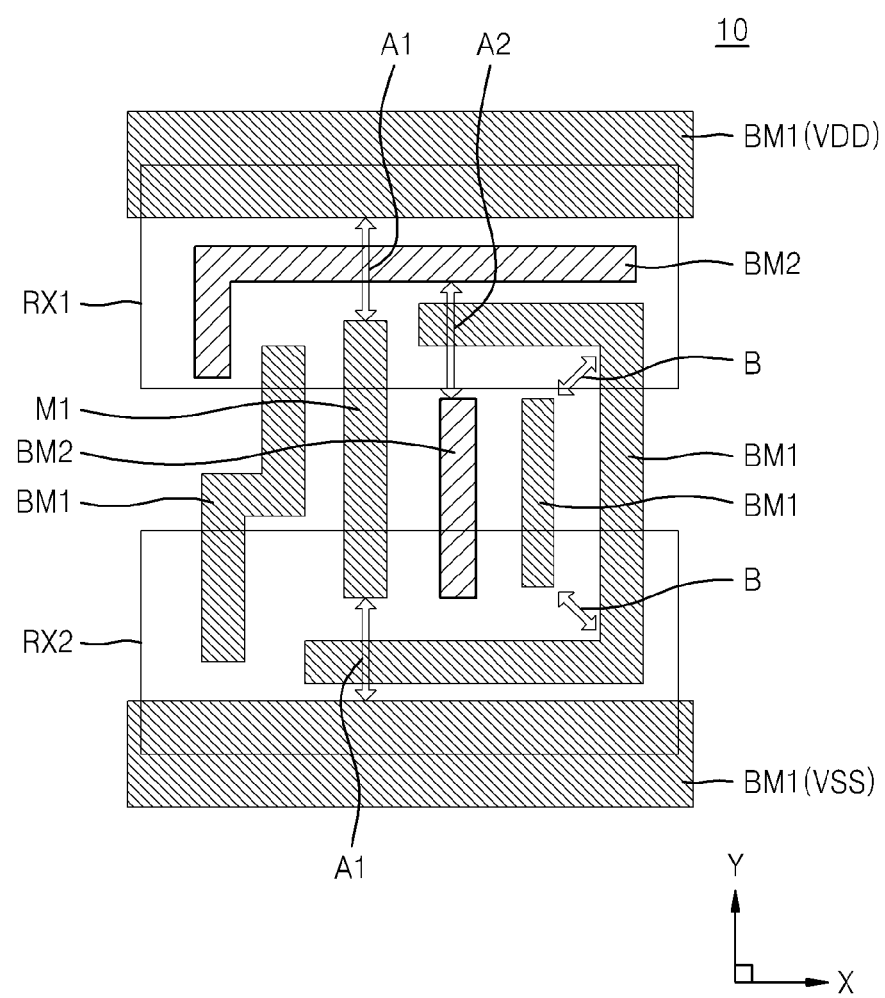
FIG. 12 is a layout diagram of a portion of a logic cell according to a comparative example.

FIG. 12 is a layout diagram of a portion of a logic cell 10 according to a comparative example. In FIG. 12, like reference numerals as those in FIGS. 1 through 9 denote like elements and detailed description thereof will be omitted.

In FIG. 12, from among elements of the logic cells 10 according to the comparative example, a first device area RX1 and a second device area RX2, in which an active area of a logic cell area LC is formed, a plurality of bidirectional wiring layers BM1 formed at a second level LV2 on a substrate, and a plurality of second bidirectional wiring layers BM2 formed at a third level LV3 which is higher than the second level LV2 are illustrated only.

In general, a wiring layer that is closest to a substrate in a multi-layer wiring structure of a logic cell is an intracell routing layer. In the intracell routing layer, even high-density contact pins (e.g. via contacts) are to be routed, and a wiring layer of a higher level, for example, the second bidirectional wiring layers BM2, are to provide sufficient space for accommodating contact pins. Thus, unlike wiring layers that are formed at a level relatively far from the substrate, strict design rules are applied to the intracell routing layer.

When a wiring layer that forms the intracell routing layer has a bidirectional structure in which wiring layers extend in two directions that cross each other, for example, in X and Y directions, like the first bidirectional wirings layer BM1 illustrated in FIG. 12, problems such as tip-to-side violation between patterns that are formed by using the same photomask or corner rounding, which frequently occurs in a bent portion of the wiring layer, may easily occur.

Figure 13A:
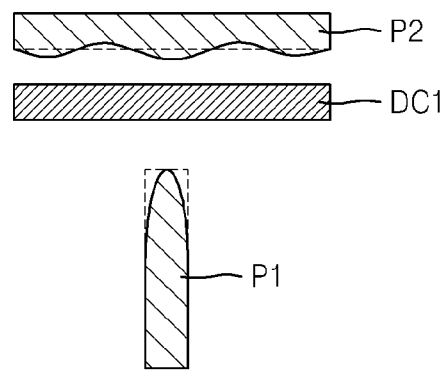
FIG. 13A is a view for explaining tip-to-side violation which may occur between two second bidirectional wiring layers.

FIG. 13A is a view for explaining tip-to-side violation which may occur between two first bidirectional wiring layers BM1 in a portion marked with an arrow A1 in FIG. 12 or between two second bidirectional wiring layers BM2 in a portion marked with an arrow A2 in FIG. 12.

In the present specification, the term "tip-to-side" denotes a shortest distance between a tip of a feature and a lateral edge of another feature.

Like the first bidirectional wiring layers BM1 and the second bidirectional wiring layers BM2 illustrated in FIG. 12, when two adjacent features that are formed by using a single photomask are disposed so as to orthogonally cross each other, if a shortest distance according to a tip-to-side minimum spacing rule is not maintained between the two adjacent features from among the wiring layers, a tip-to-side violation may occur. For example, the first bidirectional wiring layers BM1 or the second bidirectional wiring layers BM2 may form a high density wiring structure, and accordingly, if a tip of a first feature P1, which is a portion selected from the first bidirectional wiring layers BM1 or the second bidirectional wiring layers BM2, is disposed to face a lateral edge of the second feature P2, which is a portion adjacent thereto in a vertical direction, and if a shortest distance according to a tip-to-side minimum spacing rule is not maintained between the first feature P1 and the second feature P2, ripples may be formed at a lateral edge of the second feature P2 as illustrated in FIG. 13A. The ripples may cause a large deviation in widths of the wiring layers. Also, if the ripples described above are formed, a minimum insulation distance may not be provided between the second feature P2 that has the ripples and a wiring layer DC1 of a different color that is formed at the same level as the second feature P2 by using another photomask.

Figure 13B:
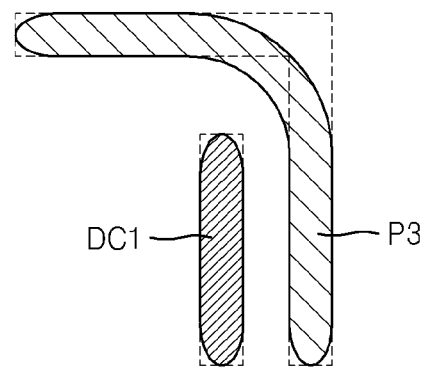
FIG. 13B is a view for explaining corner rounding which may occur between two first bidirectional wiring layers.

FIG. 13B is a view for explaining corner rounding which may occur between two first bidirectional wiring layers BM1 in a portion marked with an arrow B in FIG. 12.

If corner rounding occurs in a bent portion of a third feature P3 which is a portion of the first bidirectional wiring layers BM1, a radius of curvature of each of an inner circumferential portion and an outer circumferential portion of the rounded corner are not scaled proportionally to a pitch of wiring layers, even if the pitch is reduced in the multi-layer wiring structure. Thus, as the pitch of the wiring layers gradually reduces due to the development of multi-patterning technology, the effect and significance of radius of curvature of the rounded corner further increases. For example, in a litho-etch-litho-etch-litho-etch (LELELE) operation, which is a triple patterning operation that includes a triple exposure operation, near a bent portion of the third feature P3 at the same level as the third feature P3, in order to maintain a minimun insulation distance from the wiring layer DC of a different color, which is formed by using another photomask, corner rounding that may occur in the bent portion of the third feature P3 must be considered.

The tip-to-side violation or the corner rounding described above with reference to FIGS. 13A and 13B are significant problems to be addressed in designing a bidirectional wiring layer.

The logic cell according to the embodiments of the inventive concept includes, for example, as illustrated in FIGS. 1, 4, 7, 10A, and 11A, the first unidirectional wiring layers M1 horizontally extending on a substrate and the second unidirectional wiring layers M2 horizontally extending on the substrate and crossing the first unidirectional wiring layers M1 at a level higher than the first unidirectional wiring layers M1, which are different from the first bidirectional wiring layers BM1 and the second bidirectional wiring layers BM2 illustrated in FIG. 12. Also, the logic cell includes the deep via contact DV that is used to directly connect one of the second unidirectional wiring layers M2 to a plurality of conductive areas on the substrate, for example, to a first contact CA or a second contact CB. The deep via contact DV may directly connect the second unidirectional wiring layer M2 to a conductive area that is at a lower level than the first unidirectional wiring layer M2 without the need for the second unidirectional wiring layer M2 to contact the first unidirectional wiring layer M1.

As described above, as the logic cell according to certain aspects of the inventive concept includes a wiring structure formed by combination of the deep via contact DV and the plurality of first and second unidirectional wiring layers M1 and M2, for example, an area of the first unidirectional wiring layers M1 provided for routing may be increased. Also, in the logic cell according to certain aspects of the inventive concept, the height LCH of the logic cell area LC (see FIG. 1) may be further lowered compared to the logic cell 10 including the first bidirectional wiring layers BM1 and the second bidirectional wiring layers BM2 as illustrated in FIG. 12. For example, the logic cell according to aspects of the inventive concept uses the first unidirectional wiring layers M1 and the second unidirectional wiring layers M2 instead of the first bidirectional wiring layers BM1 and the second bidirectional wiring layers BM2 illustrated in FIG. 12, and thus, a wiring density may be distributed among the first unidirectional wiring layers M1 and the second unidirectional wiring layers M2. Thus, a routing efficiency may be increased in each of the first unidirectional wiring layers M1 and the second unidirectional wiring layers M2.

As described above, as the logic cell according to the inventive concept includes a multi-layer wiring structure including unidirectional wiring layers and deep via contacts, process complexity thereof may be reduced, and an integrated circuit device that is advantageous with respect to scaling may be implemented.

Figure 14:
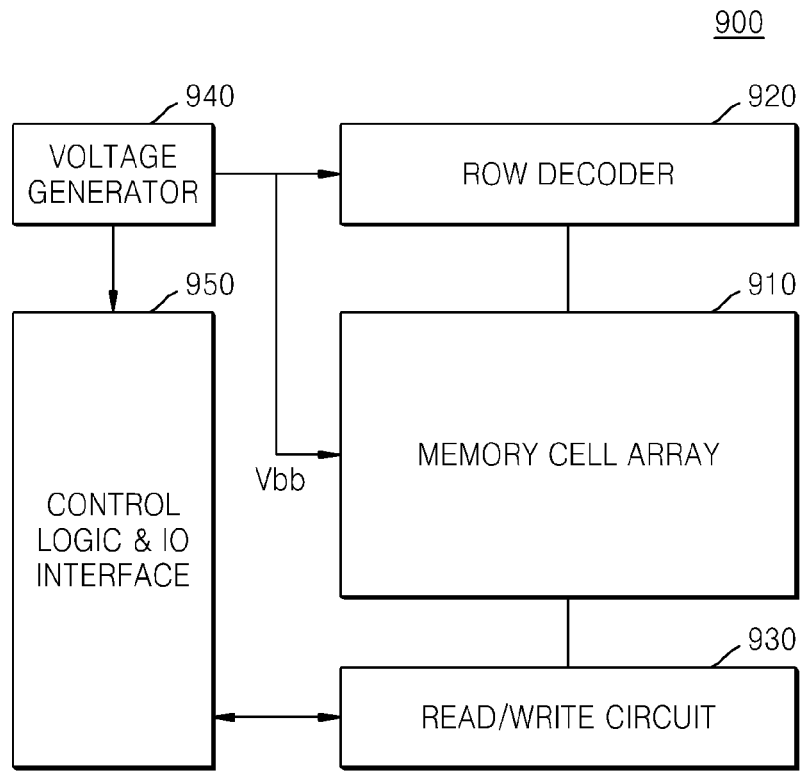
FIG. 14 is a block diagram illustrating an integrated circuit device according to embodiments of the inventive concept.

FIG. 14 is a block diagram illustrating an integrated circuit device according to embodiments of the inventive concept. An integrated circuit device formed of a nonvolatile memory device 900, which will be described with reference to FIG. 14.

Referring to FIG. 14, the nonvolatile memory device 900 may be, for example, a NAND flash memory device. However, according to the inventive concept, the nonvolatile memory device 900 is not limited to a NAND flash memory device but may also be, for example, a NOR flash memory, a resistive random access memory (RRAM), a phase-change RAM (PRAM), a magnetoresistive random access memory (MRAM), or a ferroelectric random access memory.

The nonvolatile memory device 900 may be implemented to have a three-dimensional array structure. The nonvolatile memory device 900 according to the inventive concept may be applied not only to a flash memory device that includes a charge storage layer formed of a conductive floating gate, but also to a charge trap flash (CTF) memory device that includes a charge storage layer formed of an insulation layer.

The nonvolatile memory device 900 may include a memory cell array 910, a row decoder circuit 920, a read/write circuit 930, a voltage generation circuit 940, and a control logic and input and output interface block 950.

The memory cell array 910 may include word lines arranged in a row direction and memory cells that include bit lines arranged in a column direction. The memory cells may form memory blocks.

The row decoder circuit 920 may be controlled by a control logic and input and output interface block 950, and may select and drive the word lines of the memory cell array 910.

The read/write circuit 930 is controlled by the control logic and input and output interface block 950 and may operate as a read circuit or a write circuit according to an operational mode. For example, in a read operation, the read/write circuit 930 may operate as a read circuit that reads data from the memory cell array 910 under control of the control logic and input and output interface block 950. In a write operation (or programming operation), the read/write circuit 930 may operate as a write circuit that writes data to the memory cell array 910 under control of the control logic and input and output interface block 950.

The voltage generation circuit 940 is controlled by the control logic and input and output interface block 950, and may generate voltages to operate the nonvolatile memory device 900. For example, the voltage generation circuit 940 may generate a programming voltage, a pass voltage, a verification voltage or a selection voltage to be supplied to the word lines of the memory cell array 910 or a well bias voltage Vbb to be supplied to a substrate of the memory cell array 910 or a well formed in the substrate. The well bias voltage Vbb may be one of 0 V or a negative voltage according to an operational mode.

The control logic and input and output interface block 950 may control an overall operation of the nonvolatile memory device 900. The control logic and input and output interface block 950 may provide a data transmission channel between the nonvolatile memory device 900 and an external device such as a memory controller or a host. When a programming operation is requested, the control logic and input and output interface block 950 may control the voltage generation circuit 940 such that the substrate including the memory cells or a well formed in the substrate are biased to a negative voltage.

The control logic and input and output interface block 950 includes a logic cell according to the embodiments of the inventive concept, for example, the logic cells 100, 100A, 200, 300, 400, 500, 600, 700, and 800 illustrated in FIGS. 1 through 11B.

Figure 15:
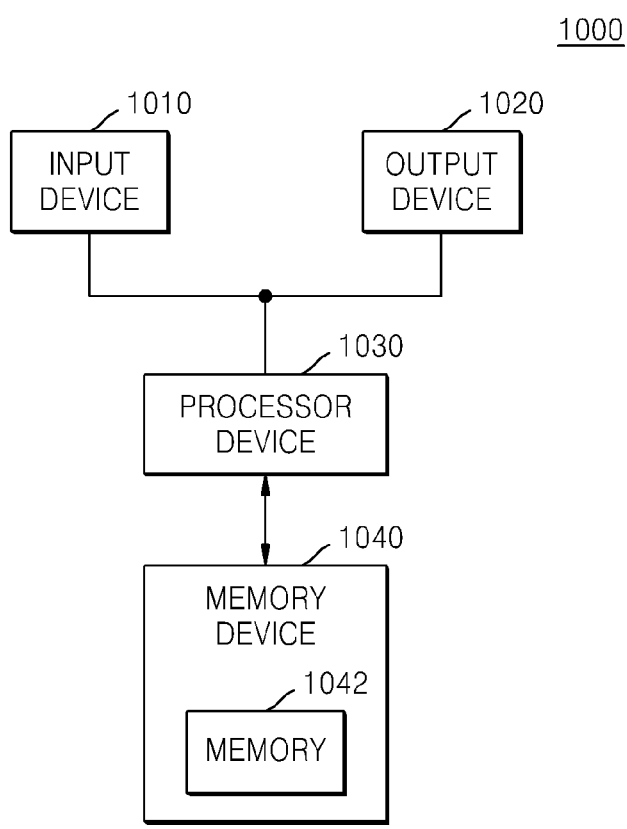
FIG. 15 illustrates an electronic system including an integrated circuit device according to embodiments of the inventive concept.

FIG. 15 illustrates an electronic system 100 including an integrated circuit device according to embodiments of the inventive concept.

Referring to FIG. 15, the electronic system 1000 includes an input device 1010, an output device 1020, a processor device 1030, and a memory device 1040.

The processor device 1030 may control the input device 1010, the output device 1020, and the memory device 1040 via a corresponding interface. The processor device 1030 may include at least one from among a microprocessor, a digital signal processor, a microcontroller, and logic devices capable of performing operations similar to those of the at least one microprocessor, the digital signal processor, and the microcontroller.

At least one of the processor device 1030 and the memory device 1040 includes at least one of the logic cells 100, 100A, 200, 300, 400, 500, 600, 700, and 800 illustrated in FIGS. 1 through 11B.

The input device 1010 and the output device 1020 may each include a keypad, a keyboard or a display device.

The memory device 1040 may include a memory 142 such as a volatile memory device or a nonvolatile memory device such as a flash memory device.

Figure 16:
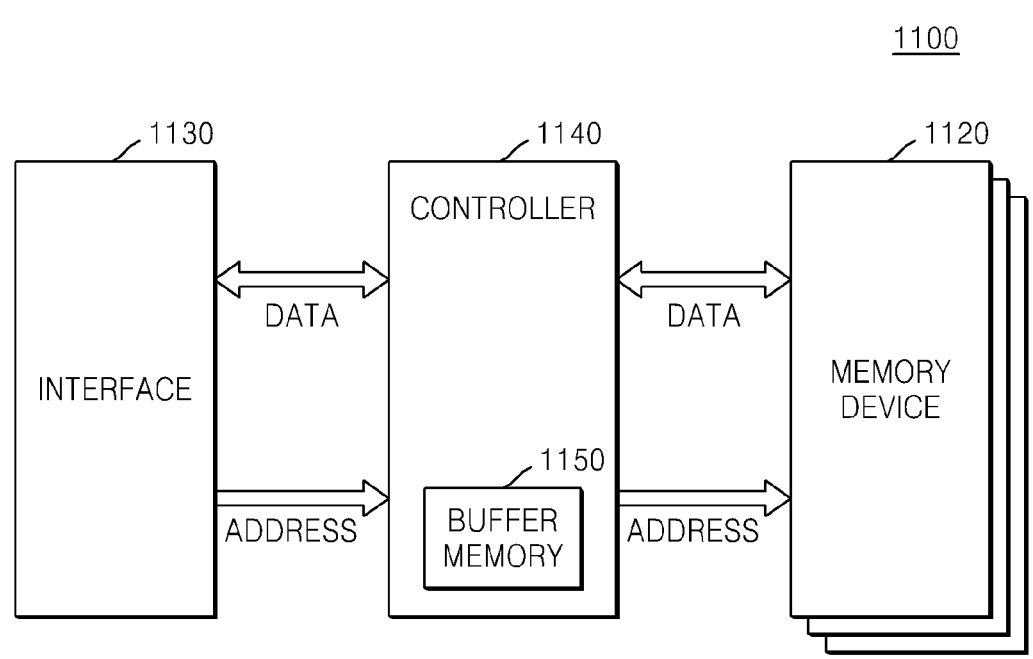
FIG. 16 is a block diagram illustrating a memory system including an integrated circuit device according to embodiments of the inventive concept.

FIG. 16 is a block diagram illustrating a memory system 1100 including an integrated circuit device according to embodiments of the inventive concept.

Referring to FIG. 16, the memory system 1100 may include an interface unit 1130, a controller 1140, and a memory device 1120.

The interface unit 1130 may provide an interface between a memory system such as the electronic system 1000 illustrated in FIG. 15 and a host. The interface unit 1130 may include a data exchange protocol corresponding to the host to interface with the host. The interface unit 1130 may communicate with the host by using one of various interface protocols such as a universal serial bus (USB), a multi-media card (MMC), a peripheral component interconnect-express (PCI-E), a serial-attached SCSI (SAS), a serial advanced technology attachment (SATA), a parallel advanced technology attachment (PATA), a small computer system interface (SCSI), an enhanced small disk interface (ESDI), and integrated drive electronics (IDE).

The controller 1140 may receive data and an address from the outside via the interface unit 1130. The controller 1140 may access a memory device, for example, the memory device 1040 illustrated in FIG. 15, based on data and an address received from the host. The controller 1140 may transmit data read from the memory device 1120 via the interface unit 1130 to the host.

The controller 1140 may include a buffer memory 1150. The buffer memory 1150 may temporarily store write data received from the host or data read from the memory device 1120.

The memory device 1120 may be provided as a storage medium of the memory system 1100. For example, the memory device 11200 may be a phase change RAM (PRAM), a magnetic RAM (MRAM), a resistive RAM (ReRAM), a ferroelectric RAM (FRAM), a NOR flash memory, or a combination of these. The memory device 1120 includes at least one of the logic cells 100, 100A, 200, 300, 400, 500, 600, 700, and 800 illustrated in FIGS. 1 through 11B according to the embodiments of the inventive concept.

The memory system 1100 illustrated in FIG. 16 may be installed in an electronic device, such as a personal digital assistant (PDA), a mobile computer, a web tablet, a digital camera, a portable media player (PMP), a mobile phone, a wireless phone, or a laptop computer. The memory system 1100 may be implemented as an MMC card, a secure digital (SD) card, a micro SD card, a memory stick, an identification (ID) card, a personal computer memory card international association (PCMCIA) card, a chip card, a USB card, a smart card, or a compact flash (CF) card.

While the inventive concept has been particularly shown and described with reference to exemplary embodiments thereof, it will be understood that various changes in form and details may be made therein without departing from the spirit and scope of the following claims.

We claim:

1. A semiconductor device comprising:
   a substrate including a first device area and a second device area;
   at least one first fin-type active area protruding from the substrate in the first device area;
   at least one second fin-type active area protruding from the substrate in the second device area;
   a gate line extending on the substrate in a direction in which the gate line crosses the at least one first fin-type active area and the at least one second fin-type active area;
   a first via contact formed at a first vertical level, the first via contact connected to the gate line between the first device area and the second device area;
   a plurality of first conductive lines extending at a second vertical level which is higher than the first vertical level;
   a plurality of second conductive lines extending at a third vertical level which is higher than the second vertical level; and
   a deep via contact between the first device area and the second device area, the deep via contact vertically extending from the first via contact to one second conductive line selected from the plurality of second conductive lines.

2. The semiconductor device of claim 1, further comprising:
   a second via contact formed at the first vertical level, the second via contact connected to one fin-type active area selected from among the at least one first fin-type active area and the at least one second fin-type active area; and
   a lower via contact vertically extending from the second via contact to one first conductive line selected from the plurality of first conductive lines,
   wherein the deep via contact has a vertical length greater than a vertical length of the lower via contact.

3. The semiconductor device of claim 2, further comprising a first upper via contact vertically extending from the one first conductive line to another second conductive line selected from the plurality of second conductive lines,
   wherein the deep via contact has a vertical length greater than a vertical length of the first upper via contact.

4. The semiconductor device of claim 1, further comprising a second upper via contact vertically extending from another first conductive line selected from the plurality of first conductive lines to the one second conductive line,
   wherein the deep via contact has a vertical length greater than a vertical length of the second upper via contact.

5. The semiconductor device of claim 1, further comprising a device isolation layer between the first device area and the second device area,
   wherein the first via contact faces the device isolation layer with the gate line interposed between the first via contact and the device isolation layer.

6. The semiconductor device of claim 1, wherein the at least one first fin-type active area comprises a plurality of first fin-type active areas spaced apart from each other with a first horizontal distance therebetween, the first horizontal distance being smaller than a second horizontal distance between the first device area and the second device area.

7. The semiconductor device of claim 1, wherein the deep via contact is an integrally formed contact formed of a continuous material.

8. The semiconductor device of claim 1, wherein the plurality of first conductive lines extend longitudinally in a first horizontal direction, and the plurality of second conductive lines extend longitudinally in a second horizontal direction crossing the first horizontal direction.

9. The semiconductor device of claim 8, wherein the gate line extends longitudinally in the second horizontal direction.

10. The semiconductor device of claim 1, wherein the deep via contact has a lower surface abutting the first via contact and an upper surface abutting the one second conductive line, and a horizontal width of the lower surface of the deep via contact is smaller than a horizontal width of the upper surface of the deep via contact.

11. The semiconductor device of claim 1, wherein a horizontal width of the deep via contact is gradually reduced toward the first via contact along a direction from an upper surface of the deep via contact to a bottom surface of the deep via contact.

12. A semiconductor device comprising:
   a substrate including a first device area and a second device area;
   a first fin-type active area protruding from the substrate in the first device area;

a second fin-type active area protruding from the substrate in the second device area;

a plurality of gate lines extending on the substrate and crossing the first fin-type active area and the second fin-type active area;

a plurality of first via contacts at a first vertical level, each of the plurality of first via contacts connected to a respective gate line of the plurality of gate lines between the first device area and the second device area;

a plurality of first conductive lines extending at a second vertical level which is higher than the first vertical level;

a plurality of second conductive lines extending at a third vertical level which is higher than the second vertical level; and a plurality of deep via contacts, each of the plurality of deep via contacts vertically extending from a respective first via contact of the plurality of first via contacts to a respective second conductive line of a set of the plurality of second conductive lines.

13. The semiconductor device of claim 12, further comprising:

a second via contact formed at the first vertical level, the second via contact connected to a source/drain area of one fin-type active area selected from the first fin-type active area and the second fin-type active area; and a lower via contact vertically extending from the second via contact to one first conductive line selected from the plurality of first conductive lines, wherein each of the plurality of deep via contacts has a vertical length greater than a vertical length of the lower via contact.

14. The semiconductor device of claim 13, further comprising a first upper via contact vertically extending from the one first conductive line to another second conductive line selected from the plurality of second conductive lines, wherein each of the plurality of deep via contacts has a vertical length greater than a vertical length of the first upper via contact.

15. The semiconductor device of claim 12, further comprising a second upper via contact vertically extending from another first conductive line selected from the plurality of first conductive lines to one of the set of the plurality of second conductive lines.

16. The semiconductor device of claim 12, wherein the plurality of deep via contacts are at the same vertical level.

17. The semiconductor device of claim 12, further comprising a device isolation layer between the first device area and the second device area, wherein the plurality of deep via contacts face the device isolation layer with the plurality of gate lines interposed between the plurality of deep via contacts and the device isolation layer.

* * * * *